United States Patent
Nakagawa et al.

(10) Patent No.: US 12,550,479 B2
(45) Date of Patent: Feb. 10, 2026

(54) METHOD FOR MANUFACTURING LIGHT-EMITTING ELEMENT

(71) Applicant: NICHIA CORPORATION, Anan (JP)

(72) Inventors: Takefumi Nakagawa, Tokushima (JP); Kazuo Takahashi, Tokushima (JP); Akira Fujioka, Tokushima (JP)

(73) Assignee: NICHIA CORPORATION, Anan (JP)

( * ) Notice: Subject to any disclaimer, the term of this patent is extended or adjusted under 35 U.S.C. 154(b) by 349 days.

(21) Appl. No.: 18/461,931

(22) Filed: Sep. 6, 2023

(65) Prior Publication Data

US 2024/0088322 A1  Mar. 14, 2024

(30) Foreign Application Priority Data

Sep. 9, 2022  (JP) ................. 2022-143904

(51) Int. Cl.
*H10H 20/01*  (2025.01)

(52) U.S. Cl.
CPC .... *H10H 20/01335* (2025.01); *H10H 20/018* (2025.01)

(58) Field of Classification Search
CPC .......... H10H 20/01335; H10H 20/831; H10H 20/018; H10H 20/833; H10H 20/84
See application file for complete search history.

(56) References Cited

U.S. PATENT DOCUMENTS

| | | |
|---|---|---|
| 6,168,962 B1 | 1/2001 | Itoh et al. |
| 2011/0220931 A1 | 9/2011 | Kojima |
| 2011/0275172 A1 | 11/2011 | Okabe |
| 2012/0299046 A1 | 11/2012 | Itonaga |
| 2012/0326117 A1 | 12/2012 | Tanaka et al. |
| 2013/0011953 A1 | 1/2013 | Nakajo et al. |
| 2013/0214320 A1 | 8/2013 | Onishi et al. |

(Continued)

FOREIGN PATENT DOCUMENTS

| | | |
|---|---|---|
| JP | H10-209506 A | 8/1998 |
| JP | 2009-176781 A | 8/2009 |
| JP | 2011-129765 A | 6/2011 |

(Continued)

*Primary Examiner* — Latanya N Crawford Eason
(74) *Attorney, Agent, or Firm* — Foley & Lardner LLP

(57) ABSTRACT

A method for manufacturing a light-emitting element includes preparing a wafer that includes a semiconductor structure body and a light-transmitting conductive film; forming a first mask on the light-transmitting conductive film; removing the light-transmitting conductive film exposed from the first mask to form an opening in the light-transmitting conductive film, the opening exposing the semiconductor structure body from under the light-transmitting conductive film; forming an n-side exposed part by removing the semiconductor structure body exposed from the first mask; removing the first mask; forming a second mask on the light-transmitting conductive film; removing the light-transmitting conductive film exposed from the second mask; forming an n-side electrode at the n-side exposed part; forming a third mask on the light-transmitting conductive film and on the semiconductor structure body; and removing the semiconductor structure body to form a groove dividing the semiconductor structure body into a plurality of element parts.

12 Claims, 34 Drawing Sheets

(56) References Cited

U.S. PATENT DOCUMENTS

2021/0358897 A1* 11/2021 Iguchi ..................... G09G 3/32
2022/0384682 A1* 12/2022 Smith .................. H10H 20/831

FOREIGN PATENT DOCUMENTS

| JP | 2011-187692 A | 9/2011 |
| JP | 2011-199122 A | 10/2011 |
| JP | 2012-248612 A | 12/2012 |
| JP | 2013-008818 A | 1/2013 |
| JP | 2013-168598 A | 8/2013 |
| JP | 2013-171982 A | 9/2013 |

* cited by examiner

METHOD FOR MANUFACTURING LIGHT-EMITTING ELEMENT

CROSS-REFERENCE TO RELATED APPLICATION

This application claims priority to Japanese Patent Application No. 2022-143904, filed on Sep. 9, 2022, the disclosure of which is hereby incorporated by reference in its entirety.

BACKGROUND

The present disclosure relates to a method for manufacturing a light-emitting element.

For example, Japanese Patent Publication No. 2013-168598 discusses a light-emitting element in which a transparent conductive film is formed on a nitride semiconductor structure body.

SUMMARY

An object of the present disclosure is to provide a method for manufacturing a light-emitting element having high reliability.

In an embodiment of the present disclosure, a method for manufacturing a light-emitting element includes preparing a wafer, the wafer including a semiconductor structure body including an n-side layer, an active layer located on the n-side layer, and a p-side layer located on the active layer, and a light-transmitting conductive film located on the p-side layer; forming a first mask on the light-transmitting conductive film; after the forming of the first mask, removing the light-transmitting conductive film exposed from the first mask to form an opening in the light-transmitting conductive film, the opening exposing the semiconductor structure body from under the light-transmitting conductive film; after the removing of the light-transmitting conductive film exposed from the first mask, forming an n-side exposed part at which a portion of the n-side layer is exposed from the p-side layer and the active layer by removing the semiconductor structure body exposed from the first mask; removing the first mask after the forming of the n-side exposed part; after the removing of the first mask, forming a second mask on the light-transmitting conductive film at a position separated from an outer edge of the light-transmitting conductive film defining the opening in a top view; after the forming of the second mask, removing the light-transmitting conductive film exposed from the second mask to expose the p-side layer from the light-transmitting conductive film; forming an n-side electrode at the n-side exposed part; after the removing of the light-transmitting conductive film exposed from the second mask, forming a third mask on the light-transmitting conductive film and on the semiconductor structure body; and after the forming of the third mask, removing the semiconductor structure body in a region not overlapping the third mask in the top view to form a groove in the semiconductor structure body, the groove dividing the semiconductor structure body into a plurality of element parts.

According to the present disclosure, a method for manufacturing a light-emitting element having high reliability can be provided.

DETAILED DESCRIPTION

Figure 1:
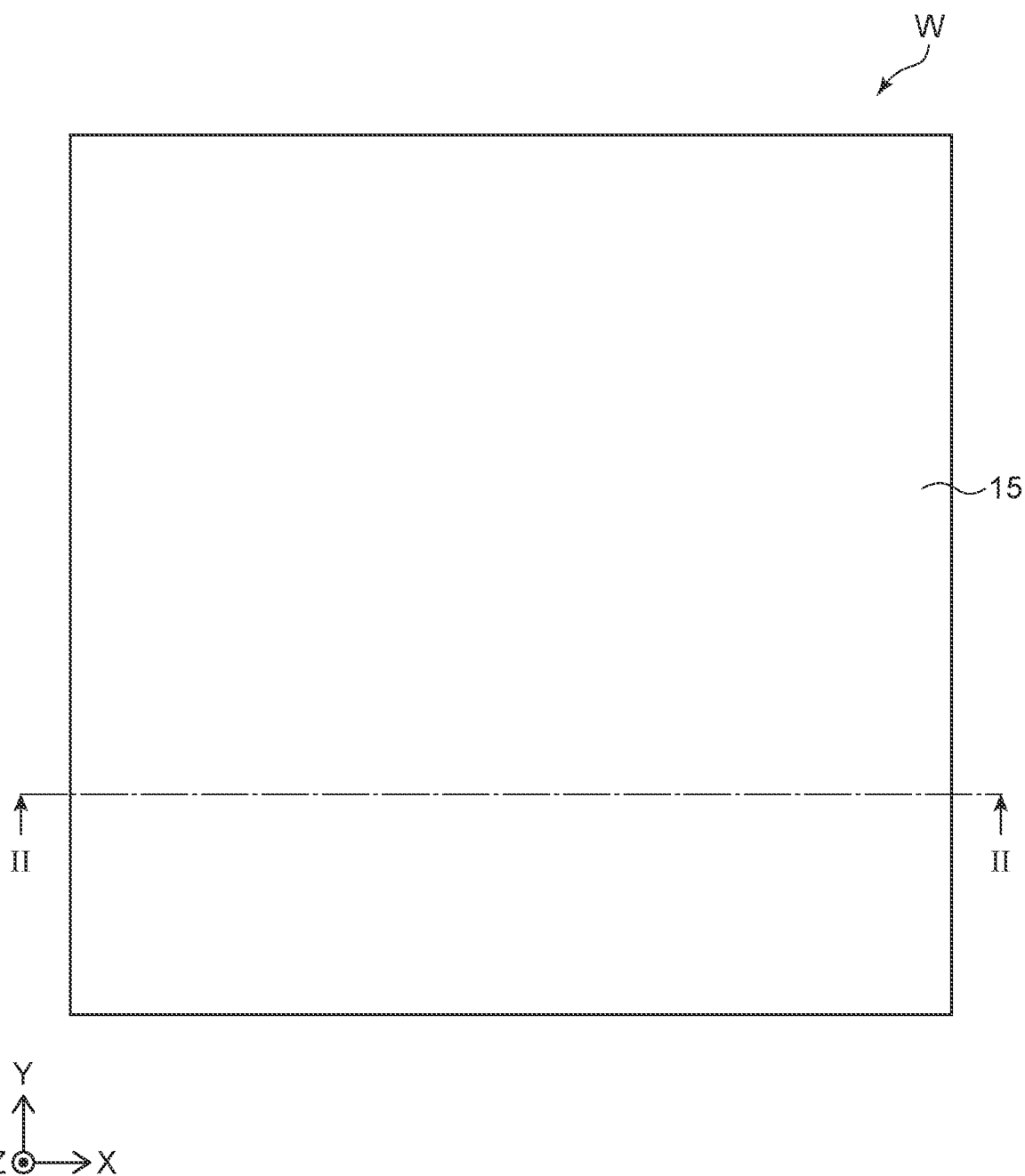
FIG. 1 is a schematic plan view for describing one process of a method for manufacturing a light-emitting element of an embodiment.

Embodiments will now be described with reference to the drawings. Unless specifically stated, the dimensions, materials, shapes, relative arrangements, and the like of the components according to the embodiments are not intended to limit the scope of the invention to those only, and are merely illustrative examples. The sizes, positional relationships, and the like shown in the drawings may be exaggerated for clarity of description. In the following description, the same names and reference numerals indicate the same or similar members, and a detailed description is omitted as appropriate. End views that show only cross sections may be used as cross-sectional views.

In the following description, terms that indicate specific directions or positions (e.g., "above," "below", and other terms including or related to such terms) may be used. Such terms, however, are used merely for better understanding of relative directions or positions when referring to the drawings. As long as the relationships are the same, the relative directions or positions according to terms such as "above," "below," etc., used when referring to the drawings may not have the same arrangements in drawings, actual products, and the like outside the disclosure. In the specification, when assuming that there are, for example, two members, the positional relationship expressed as "above (or below)" includes the case where the two members are in contact, and the case where the two members are not in contact so that one of the members is positioned above (or below) the other member. Unless specifically stated, a member covering a covered object includes the case where the member contacts the covered object and directly covers the covered object, and the case where the member indirectly covers the covered object without contacting the covered object.

Directions may be indicated by an X-axis, a Y-axis, and a Z-axis in the drawings below. The X-axis, the Y-axis, and the Z-axis are orthogonal to each other. For example, in the specification, a direction along the X-axis is taken as a first direction X, a direction along the Y-axis is taken as a second direction Y, and a direction along the Z-axis is taken as a third direction Z.

Process of Preparing Wafer

Figure 2:
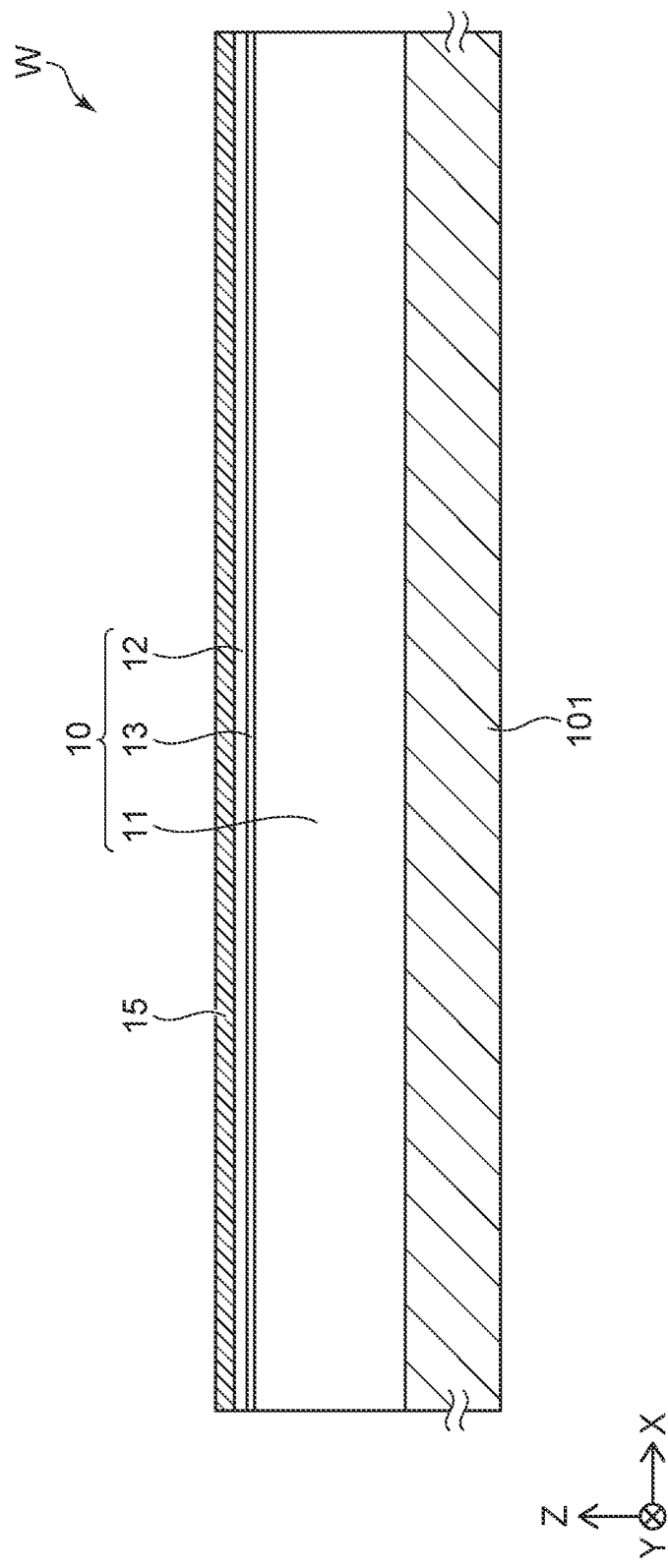
FIG. 2 is a schematic cross-sectional view along line II-II of FIG. 1.
Figure 3:
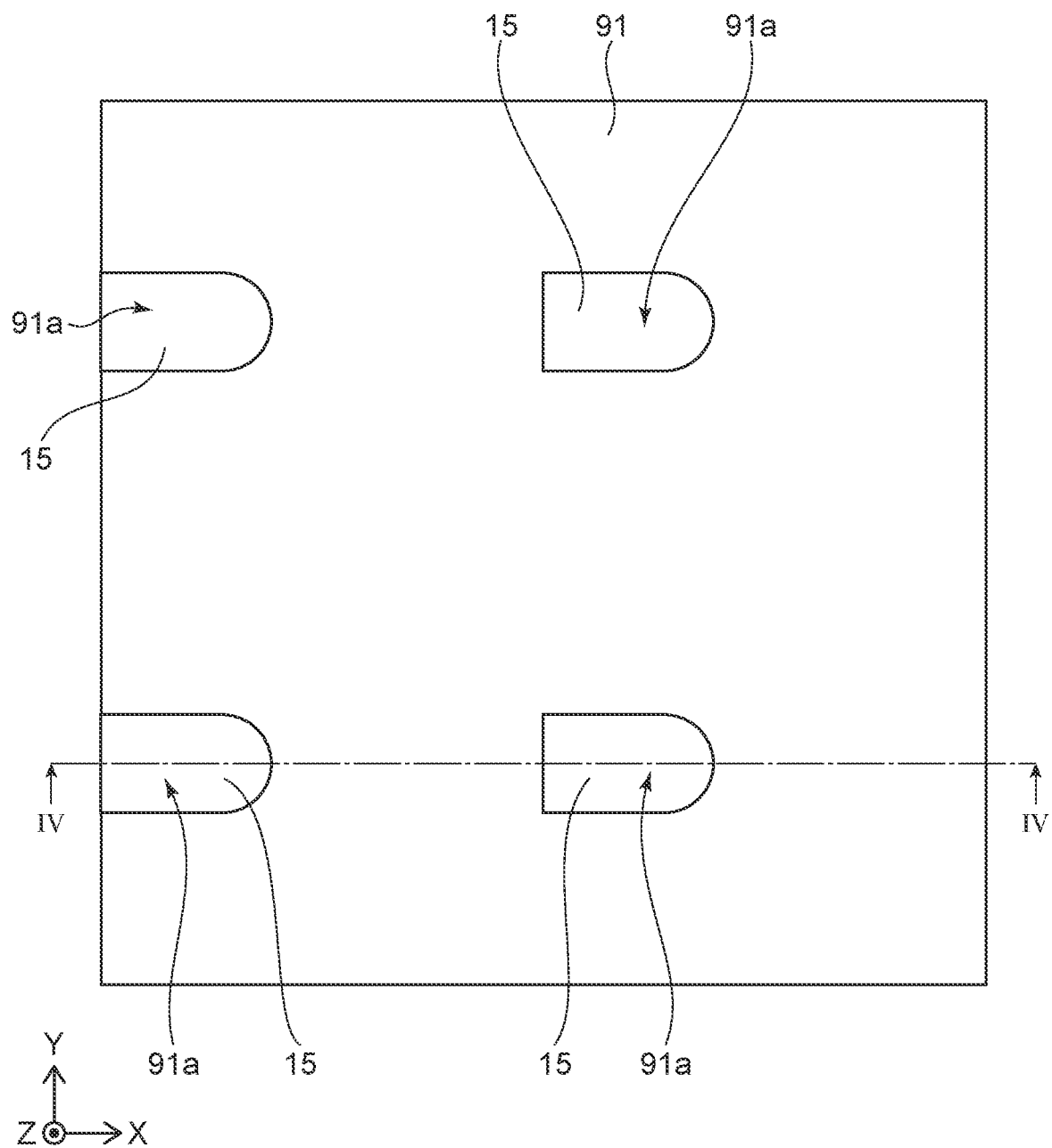
FIG. 3 is a schematic plan view for describing one process of the method for manufacturing the light-emitting element of the embodiment.

A method for manufacturing a light-emitting element of an embodiment includes a process of preparing a wafer W shown in FIGS. 1 and 2. FIGS. 1 and 2 illustrate one portion of the wafer W. FIG. 3 and subsequent drawings which illustrate processes continuing from FIGS. 1 and 2 also illustrate one portion of the wafer W.

As shown in FIG. 2, the wafer W includes a semiconductor structure body 10 and a light-transmitting conductive film 15. The wafer W also includes a first substrate 101 used to form the semiconductor structure body 10. The wafer W does not necessarily include the first substrate 101.

The semiconductor structure body 10 is made of a nitride semiconductor. In the specification, "nitride semiconductor" includes, for example, all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are changed within the ranges respectively. "Nitride semiconductor" further includes Group V elements other than N (nitrogen) in the chemical formula above, various elements added to control various properties such as the conductivity type, etc.

The semiconductor structure body 10 includes an n-side layer 11, an active layer 13 located on the n-side layer 11, and a p-side layer 12 located on the active layer 13. The active layer 13 is positioned between the n-side layer 11 and the p-side layer 12 in the third direction Z. The active layer 13 is a light-emitting layer that emits light and has, for example, a MQW (Multiple Quantum well) structure including multiple barrier layers and multiple well layers. For example, the active layer 13 may emit light having a peak wavelength of not less than 210 nm and not more than 580 nm. The n-side layer 11 includes a semiconductor layer including an n-type impurity. The p-side layer 12 includes a semiconductor layer including a p-type impurity.

For example, the n-side layer 11, the active layer 13, and the p-side layer 12 are formed in this order on the first substrate 101 by MOCVD (Metal Organic Chemical Vapor Deposition). The first substrate 101 can include, for example, an insulating substrate of sapphire or spinel ($MgAl_2O_4$) having one of a C-plane, an R-plane, or an A-plane as a major surface. A conductive substrate of SiC (including 6H, 4H, and 3C), ZnS, ZnO, GaAs, Si, etc., can be used as the first substrate 101. According to the embodiment, a sapphire substrate having a C-plane as the major surface is used as the first substrate 101.

The light-transmitting conductive film 15 is located on the p-side layer 12. For example, the light-transmitting conductive film 15 is formed by sputtering or vapor deposition. For example, ITO (Indium Tin Oxide), IZO (Indium Zinc Oxide), ZnO, $In_2O_3$, etc., can be used as the material of the light-transmitting conductive film 15. The light-transmitting conductive film 15 has the function of diffusing the current supplied via a p-side electrode 32 described below in the planar direction of the p-side layer 12. The thickness of the light-transmitting conductive film 15 can be, for example, not less than 0.03 μm and not more than 0.2 μm. In the specification, the "thickness" of each member refers to the maximum thickness in the third direction Z.

Process of Forming First Mask

Figure 4:
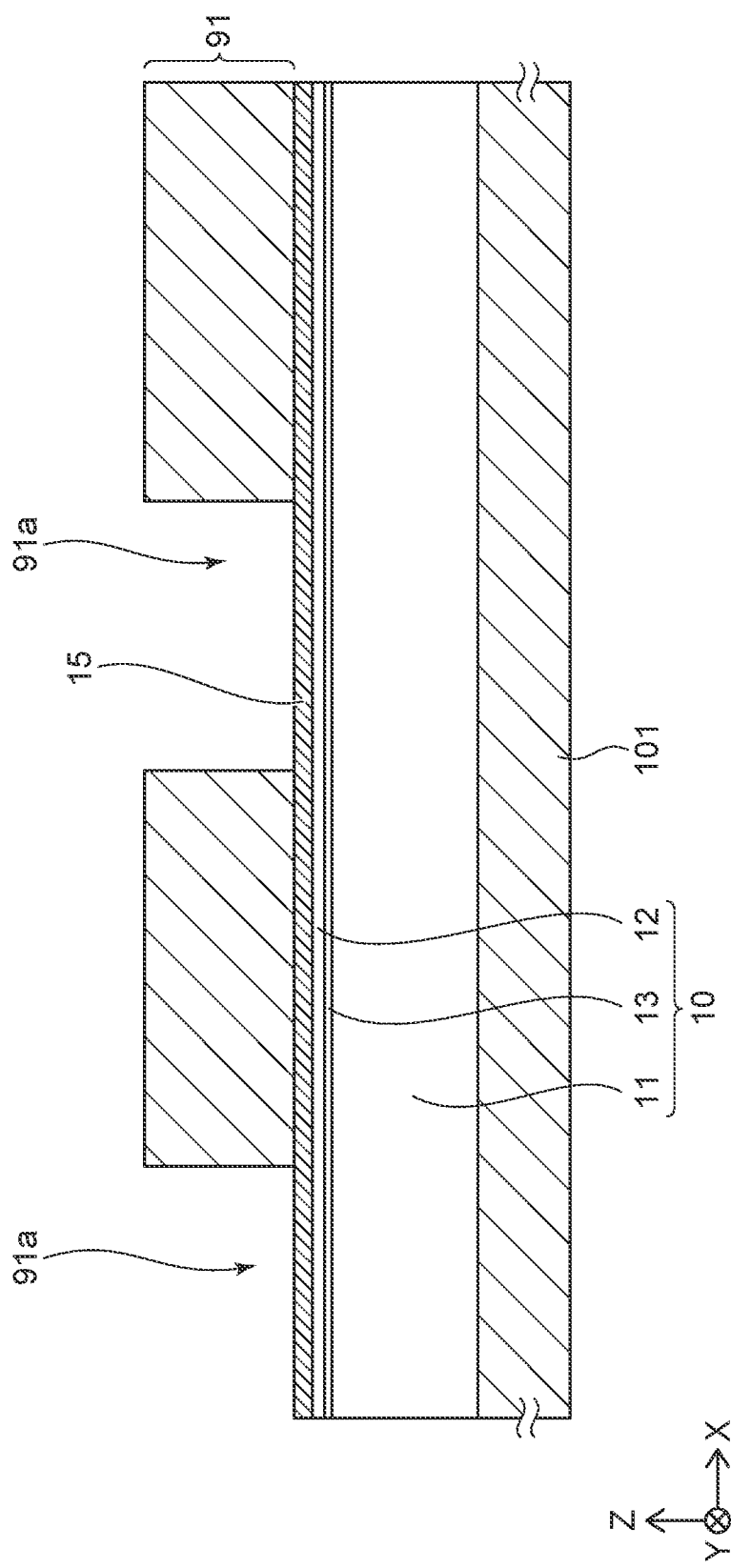
FIG. 4 is a schematic cross-sectional view along line IV-IV of FIG. 3.

After the process of preparing the wafer W, the method for manufacturing the light-emitting element of the embodiment includes a process of forming a first mask 91 on the light-transmitting conductive film 15 as shown in FIGS. 3 and 4.

The first mask 91 can include, for example, a photoresist. Multiple mask openings 91a are formed in the first mask 91 by exposing and developing. The multiple mask openings 91a are separated from each other in the first and second directions X and Y in the top view. The light-transmitting conductive film 15 is exposed from the first mask 91 in the mask openings 91a.

Process of Removing Light-Transmitting Conductive Film Exposed from First Mask

Figure 5:
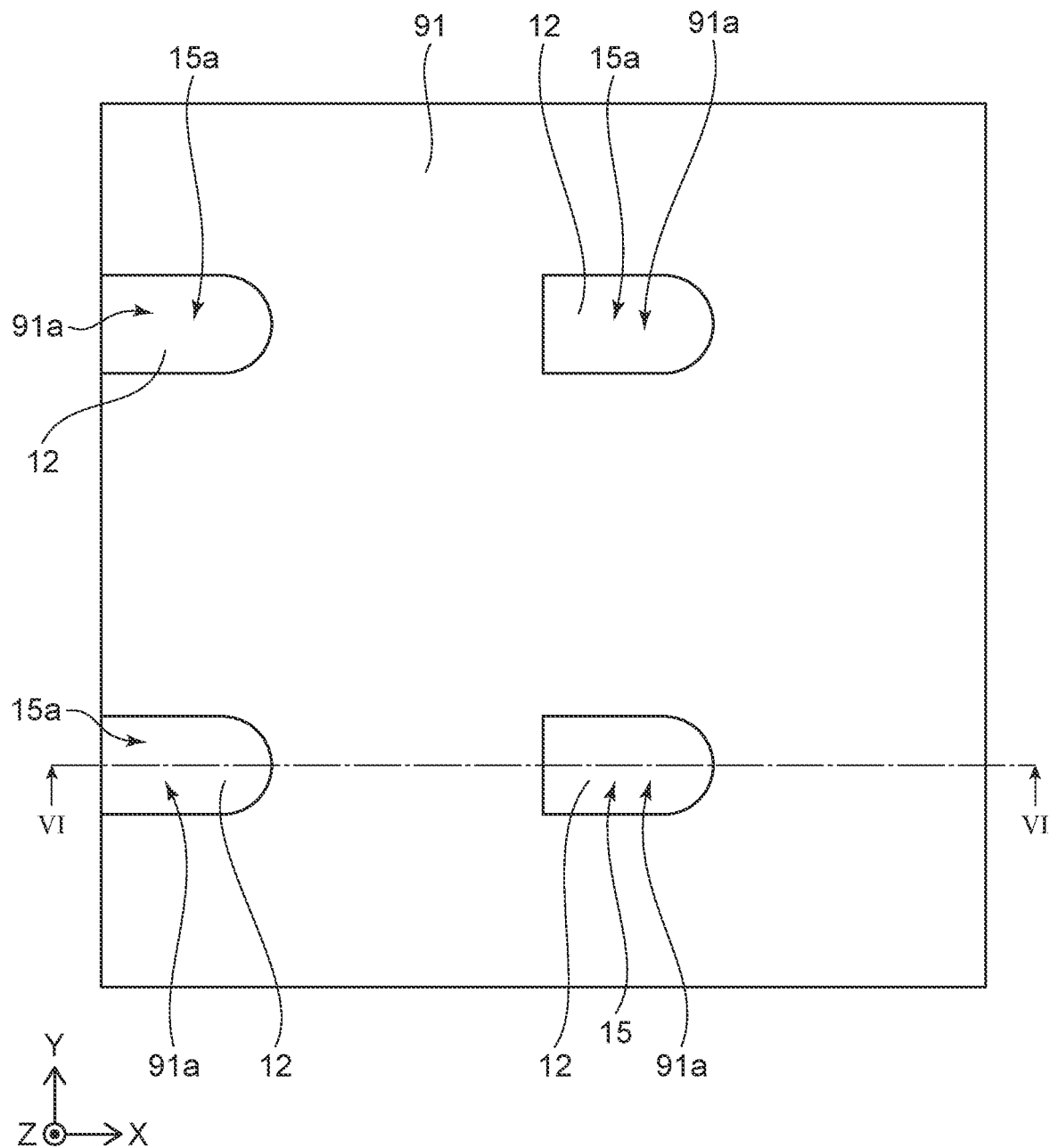
FIG. 5 is a schematic plan view for describing one process of the method for manufacturing the light-emitting element of the embodiment.
Figure 6:
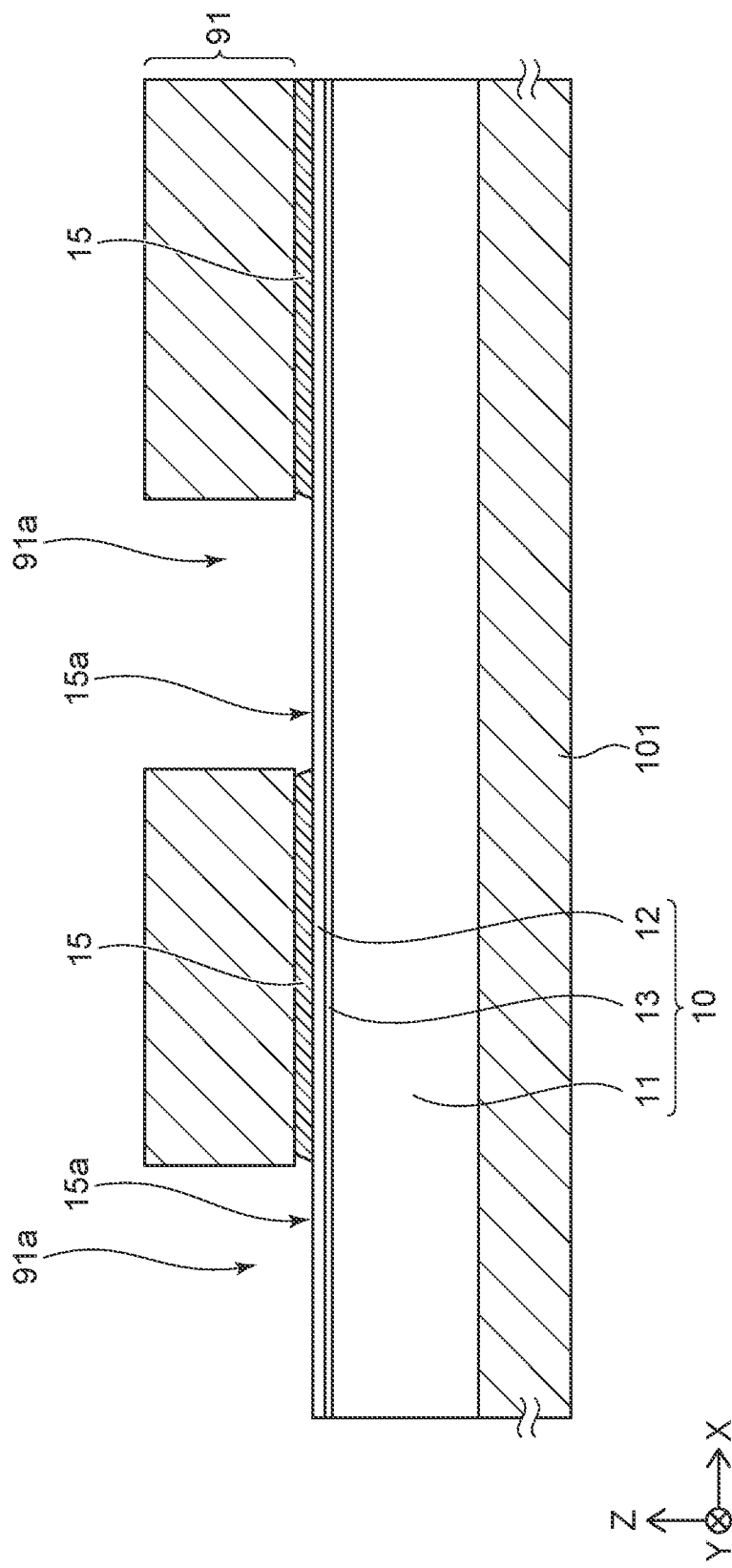
FIG. 6 is a schematic cross-sectional view along line VI-VI of FIG. 5.

After the process of forming the first mask 91, the method for manufacturing the light-emitting element of the embodiment includes a process of removing the light-transmitting conductive film 15 not covered with the first mask 91 to form openings 15a in the light-transmitting conductive film 15 that expose the semiconductor structure body from under the light-transmitting conductive film 15 as shown in FIGS. 5 and 6. As shown in FIG. 5, the openings 15a are formed at positions at which the openings 15a overlap the mask openings 91a in the top view. The multiple openings 15a are separated from each other in the first and second directions X and Y. The upper surface of the A-side layer 12 is exposed from the light-transmitting conductive film 15 in the openings 15a.

It is preferable for the light-transmitting conductive film 15 to be removed by wet etching. By removing the light-transmitting conductive film 15 by wet etching, compared to removing the light-transmitting conductive film 15 by dry etching, the productivity can be increased because it is easy to simultaneously process many wafers. For example, hydrochloric acid, nitric acid, a mixed liquid of hydrochloric acid and nitric acid, etc., can be used as the etchant used in the wet etching.

Process of Forming n-Side Exposed Part

Figure 7:
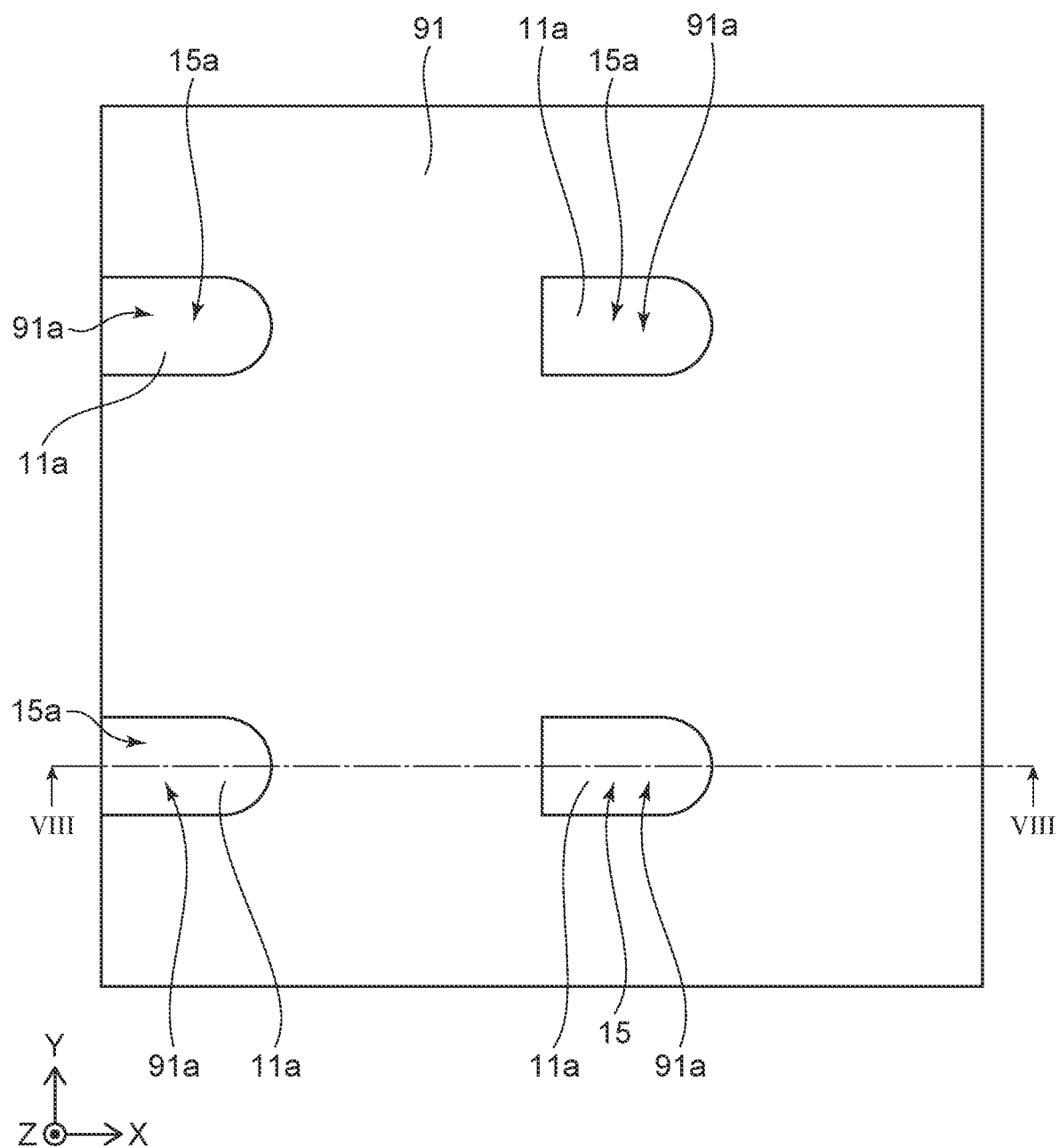
FIG. 7 is a schematic plan view for describing one process of the method for manufacturing the light-emitting element of the embodiment.
Figure 8:
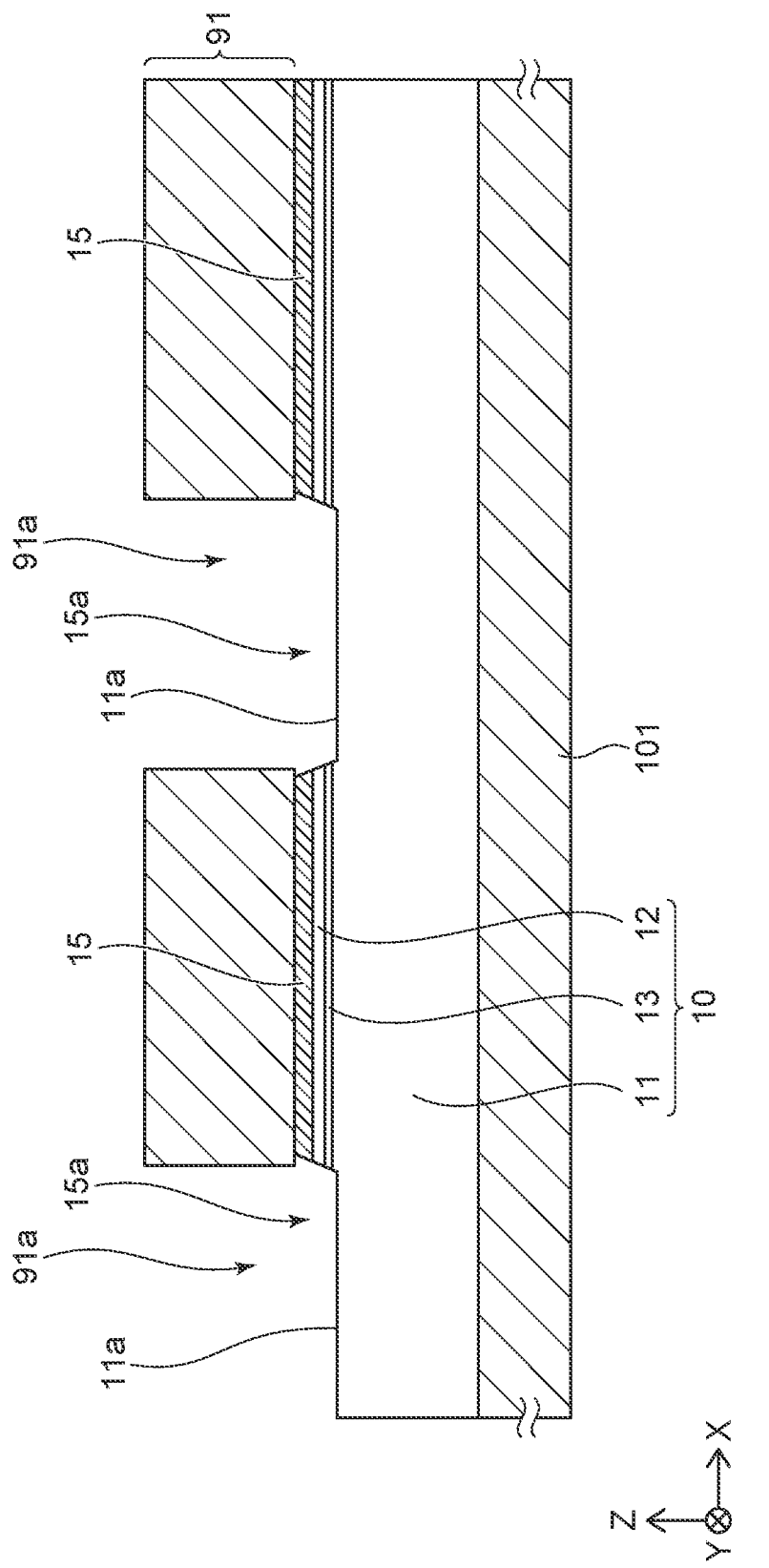
FIG. 8 is a schematic cross-sectional view along line VIII-VIII of FIG. 7.

After the process of removing the light-transmitting conductive film 15 not covered with the first mask 91, the method for manufacturing the light-emitting element of the embodiment includes a process of forming n-side exposed parts 11a at which portions of the n-side layer 11 are exposed from under the p-side layer 12 and the active layer 13 by removing the semiconductor structure body 10 not covered with the first mask 91 as shown in FIGS. 7 and 8.

As shown in FIG. 7, the n-side exposed parts 11a are formed at positions at which the n-side exposed parts 11a overlap the mask openings 91a and the openings 15a of the light-transmitting conductive film 15 in the top view. The multiple n-side exposed parts 11a are separated from each other in the first and second directions X and Y.

It is preferable for the process of forming the n-side exposed parts 11a to include removing the semiconductor structure body 10 not covered with the first mask 91 by, for example, dry etching. The removal amount of the semiconductor structure body 10 is easily controlled by removing the semiconductor structure body 10 by dry etching. The n-side exposed parts 11a are formed by removing the p-side layer 12 and the active layer 13 exposed from the first mask 91 in the mask openings 91a to expose portions of the n-side layer 11 from under the light-transmitting conductive film 15, the p-side layer 12, and the active layer 13. For example, RIE (Reactive Ion Etching) is an example of a dry etching method. At this time, for example, a gas that includes chlorine, e.g., a gas such as $Cl_2$, $SiCl_4$, etc., can be used in the RIE.

The process of removing the light-transmitting conductive film 15 not covered with the first mask 91 and the process of removing the semiconductor structure body 10 not covered with the first mask 91 may be performed using the same etching method.

Process of Removing First Mask

After the process of forming the n-side exposed parts 11a, the method for manufacturing the light-emitting element of the embodiment includes a process of removing the first mask 91. For example, the first mask 91 is removed using an organic solvent and/or ozone water. The removal of the first mask 91 may be performed by ashing with oxygen plasma.

Process of Forming Second Mask

Figure 9:
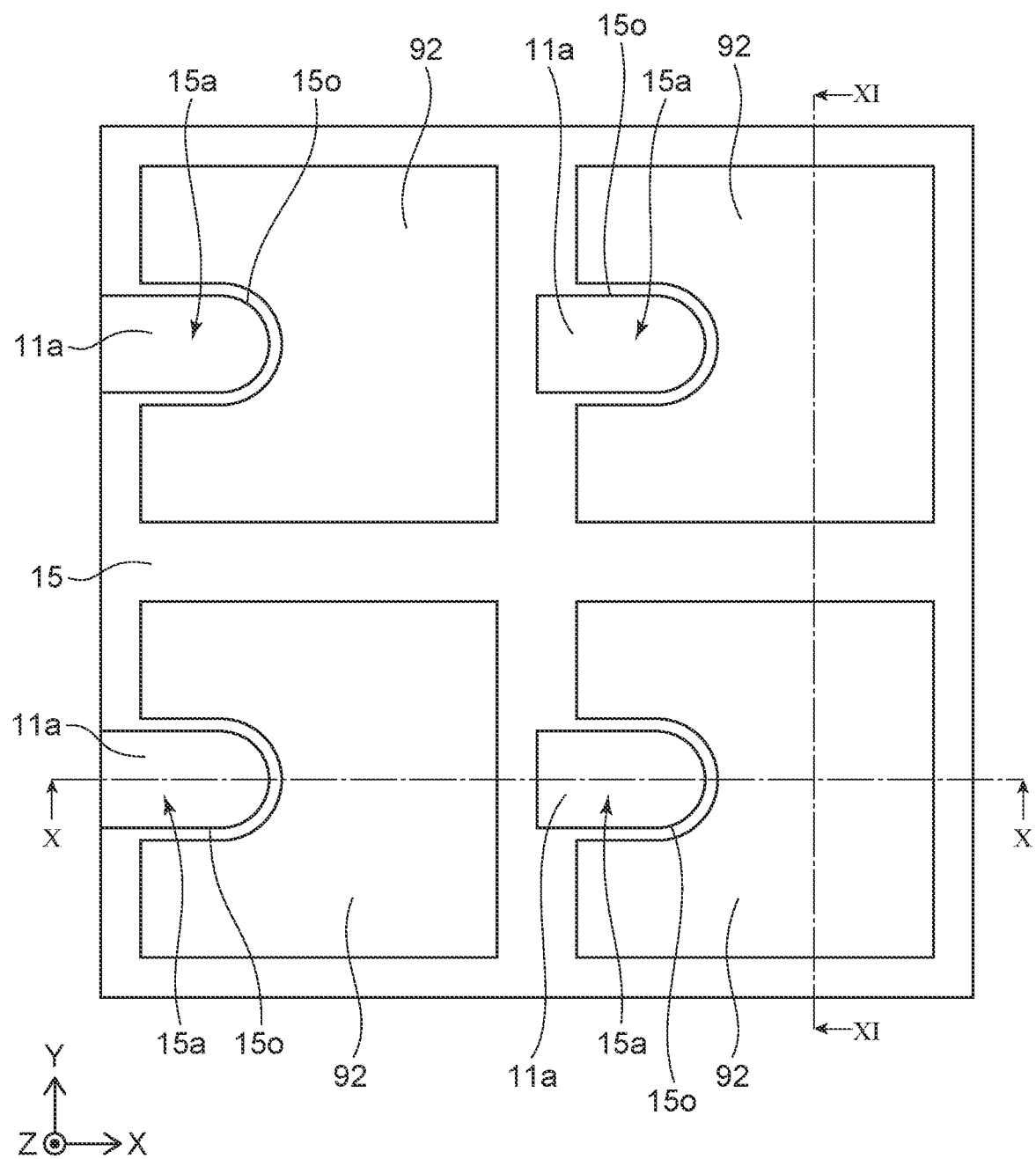
FIG. 9 is a schematic plan view for describing one process of the method for manufacturing the light-emitting element of the embodiment.
Figure 10:
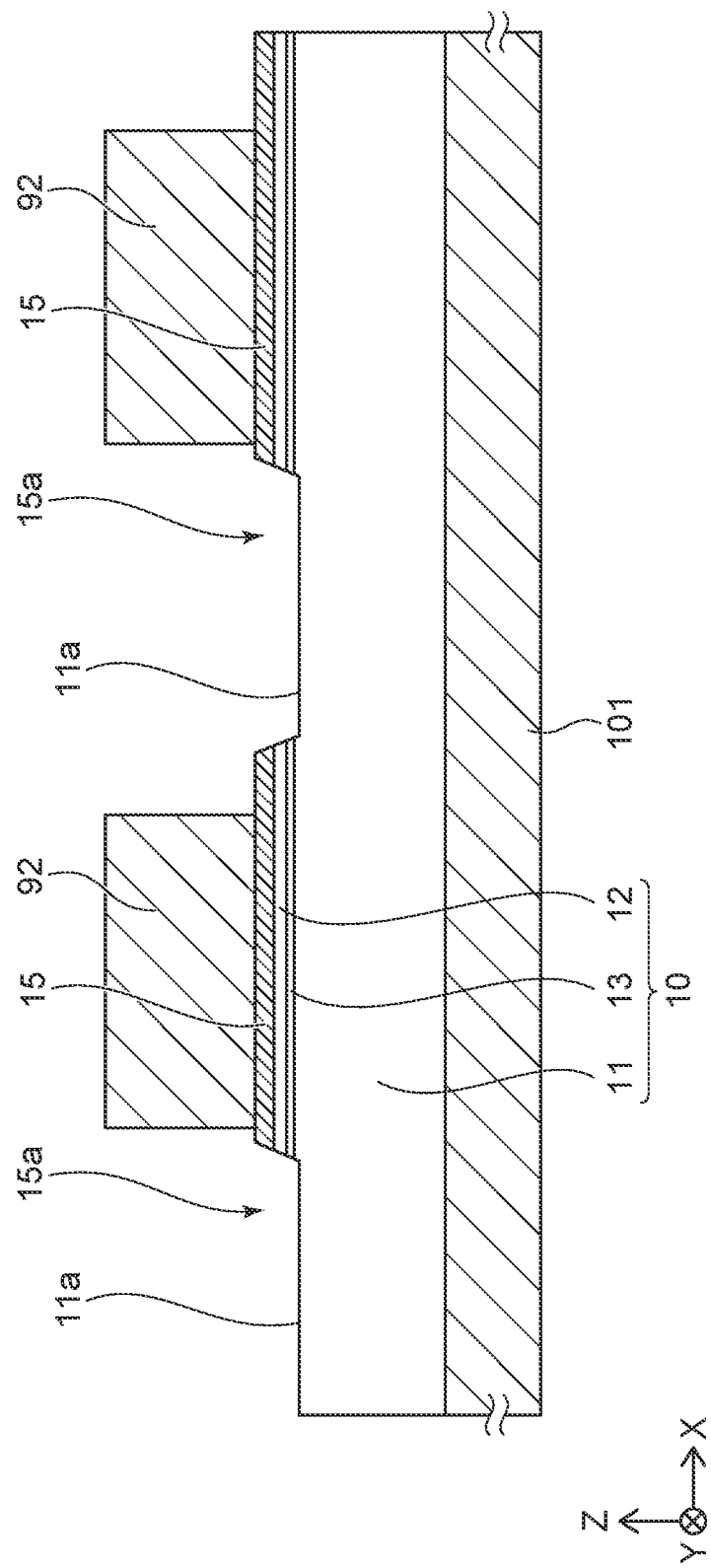
FIG. 10 is a schematic cross-sectional view along line X-X of FIG. 9.
Figure 11:
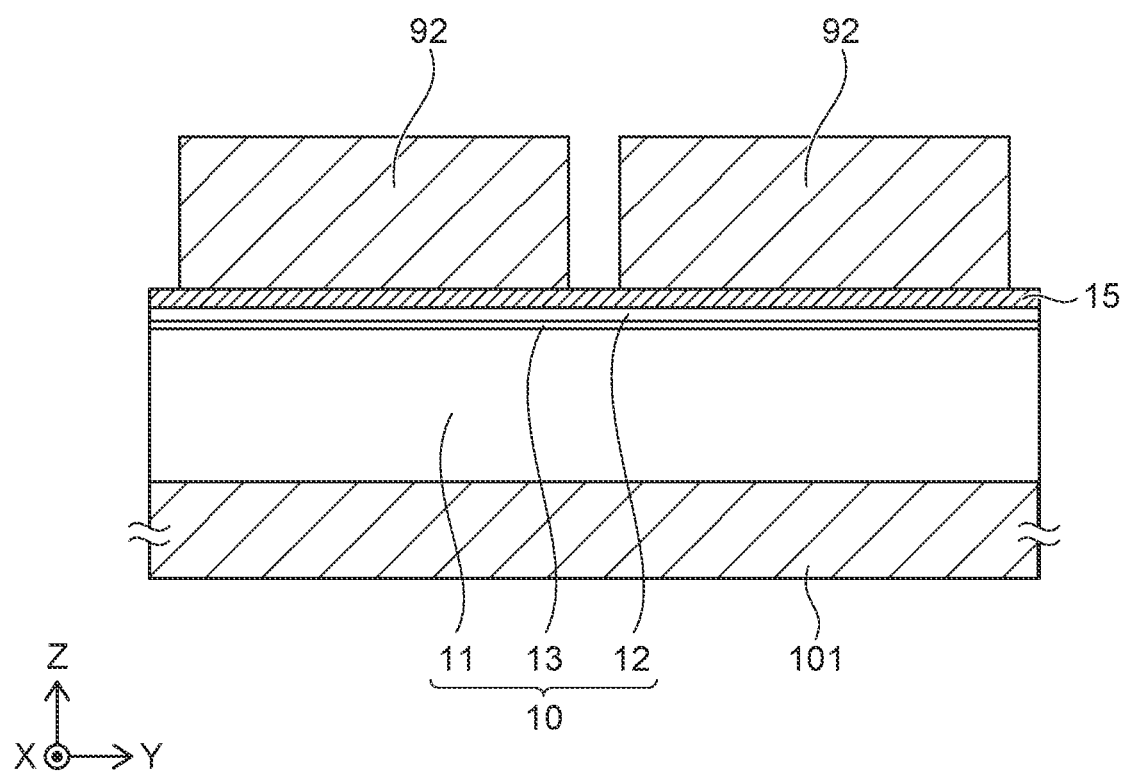
FIG. 11 is a schematic cross-sectional view along line XI-XI of FIG. 9.

After the process of removing the first mask 91, the method for manufacturing the light-emitting element of the embodiment includes a process of forming a second mask 92 on the light-transmitting conductive film 15 as shown in FIGS. 9 to 11.

The second mask 92 can include, for example, a photoresist. Multiple second masks 92 are formed by exposing and developing to be separated from each other in the first and second directions X and Y in the top view.

As shown in FIGS. 9 to 11, the light-transmitting conductive film 15 that is positioned between the second masks 92 next to each other in the first and second directions X and Y is exposed from the second masks 92. The second masks 92 are formed at positions on the light-transmitting conductive film 15 separated from outer edges 15o of the light-transmitting conductive film 15 defining the openings 15a in the top view. The second masks 92 do not overlap the outer edges 15o of the light-transmitting conductive film 15 defining the openings 15a in the top view.

Figure 12:
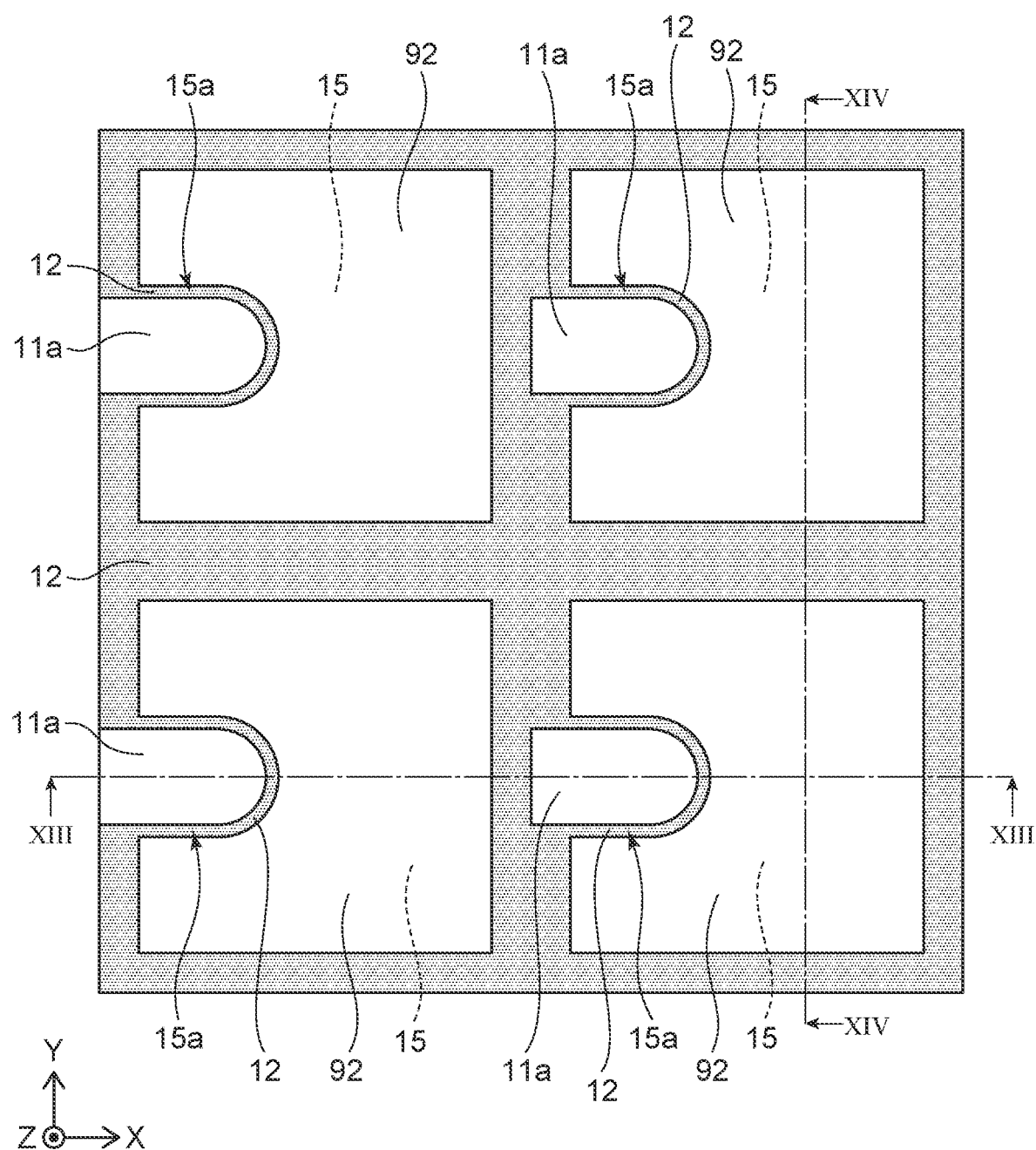
FIG. 12 is a schematic plan view for describing one process of the method for manufacturing the light-emitting element of the embodiment.
Figure 13:
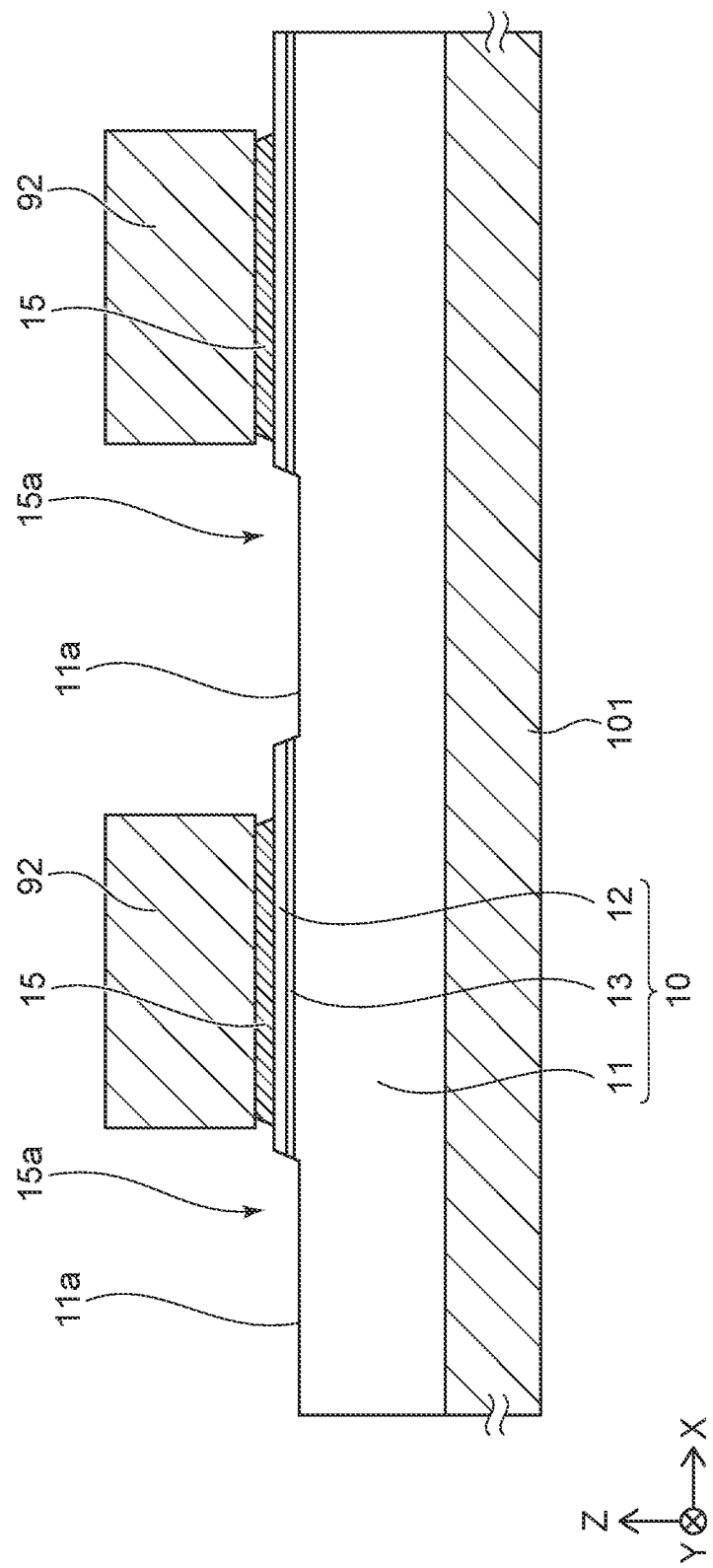
FIG. 13 is a schematic cross-sectional view along line XIII-XIII of FIG. 12.
Figure 14:
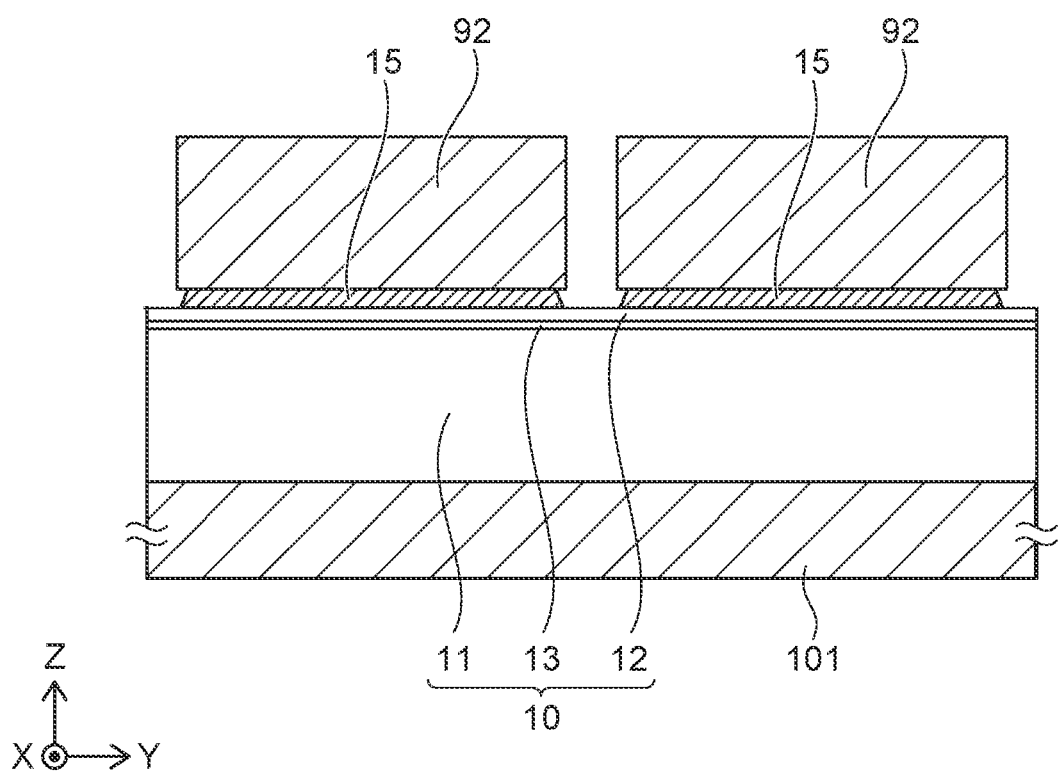
FIG. 14 is a schematic cross-sectional view along line XIV-XIV of FIG. 12.

Process of Removing Light-Transmitting Conductive Film Exposed from Second Masks After the process of forming the second masks 92, the method for manufacturing the light-emitting element of the embodiment includes a process of removing the light-transmitting conductive film 15 exposed from the second masks 92. As shown in FIGS. 12 to 14, the p-side layer 12 is exposed from under the light-transmitting conductive film by this process. In FIG. 12, the region where the p-side layer 12 is exposed from under the light-transmitting conductive film 15 by the process of removing the light-transmitting conductive film 15 exposed from the second masks 92 is illustrated by cross hatching.

As shown in FIGS. 12 and 13, multiple light-transmitting conductive films 15 that are separated from each other in the first and second directions X and Y in the top view are formed by the process of removing the light-transmitting conductive film 15 not covered with the second masks 92. Each light-transmitting conductive film 15 is positioned between the second mask 92 and the p-side layer 12.

Similar to the process of removing the light-transmitting conductive film 15 not covered with the first mask 91, it is preferable to remove the light-transmitting conductive film 15 by wet etching in the process of removing the light-transmitting conductive film not covered with the second masks 92. The same etchant can be used in the process of removing the light-transmitting conductive film 15 not covered with the first mask 91 and the process of removing the light-transmitting conductive film 15 not covered with the second masks 92.

Due to the shape difference in the top view between the first mask 91 and the second masks 92, the ease of penetration of the etchant is different between the process of removing the light-transmitting conductive film 15 not covered with the first mask 91 and the process of removing the light-transmitting conductive film 15 not covered with the second masks 92. It is therefore preferable to use different wet etching times in the process of removing the light-transmitting conductive film 15 not covered with the first mask 91 and the process of removing the light-transmitting conductive film 15 not covered with the second masks 92.

According to the embodiment, in the process of forming the first mask 91 as shown in FIG. 3, the first mask 91 that includes the multiple mask openings 91a is formed. In the process of forming the second masks 92 as shown in FIG. 12, the multiple second masks 92 that are separated from each other are formed. Because the second masks 92 are separated from each other, the etchant easily flows around to the outer edge vicinity of the second masks 92 in the top view, and the etching of the light-transmitting conductive film 15 proceeds more easily than the removal process of the light-transmitting conductive film 15 using the first mask 91 in which the etchant penetrates only through the mask opening 91a. Stated conversely, in the process of removing the light-transmitting conductive film 15 not covered with the first mask 91, the etching of the light-transmitting conductive film 15 proceeds less easily than the process of removing the light-transmitting conductive film 15 not covered with the second masks 92. It is therefore preferable to set the time of the wet etching in the process of removing the light-transmitting conductive film 15 not covered with the first mask 91 to be greater than the time of the wet etching in the process of removing the light-transmitting conductive film 15 not covered with the second masks 92.

Process of Removing Second Masks

After the process of removing the light-transmitting conductive film 15 not covered with the second masks 92, the method for manufacturing the light-emitting element of the embodiment includes a process of removing the second masks 92. The second masks 92 can be removed using the same method as the method of removing the first mask 91.

Process of Forming Electrodes

Figure 15:
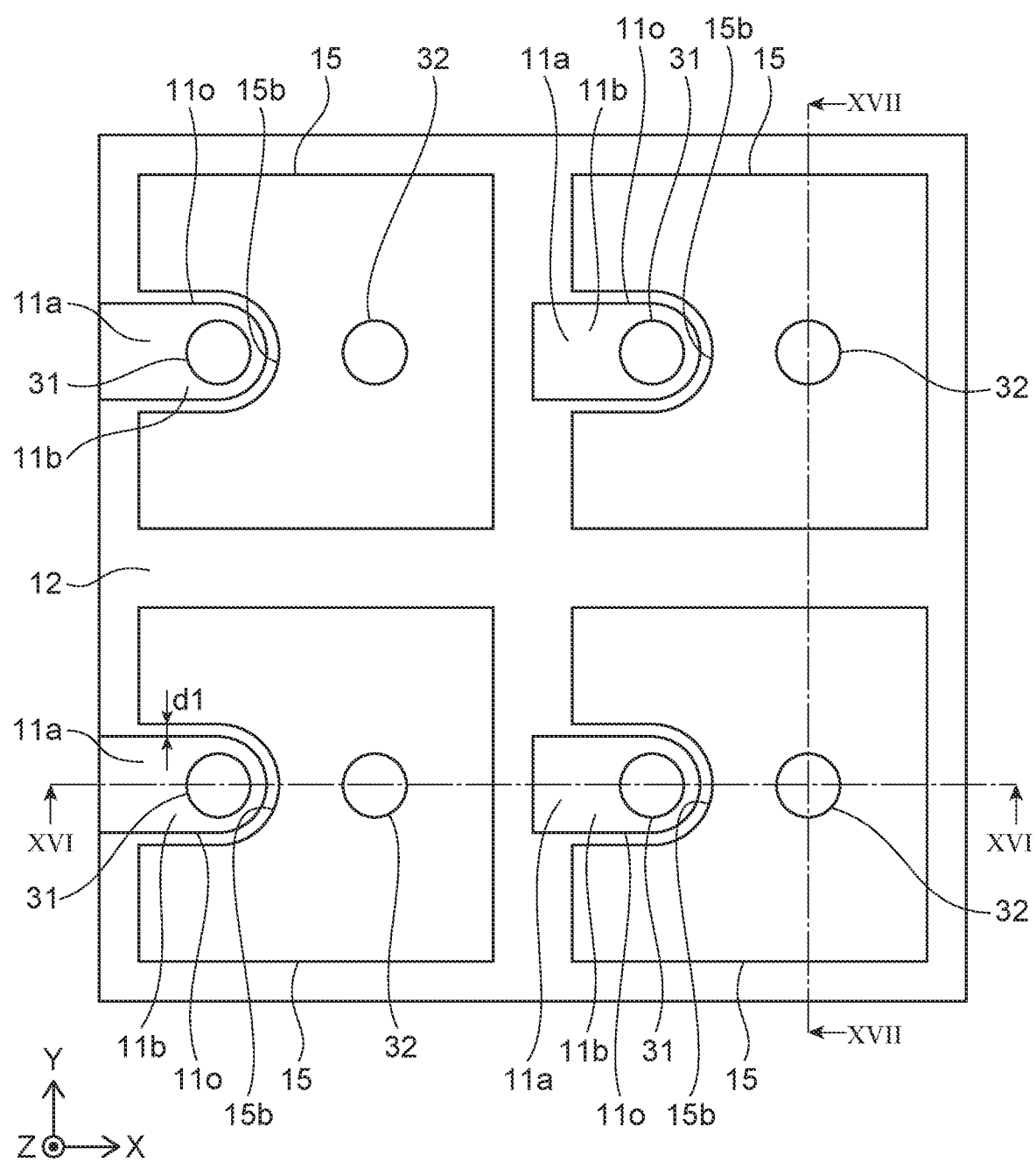
FIG. 15 is a schematic plan view for describing one process of the method for manufacturing the light-emitting element of the embodiment.
Figure 16:
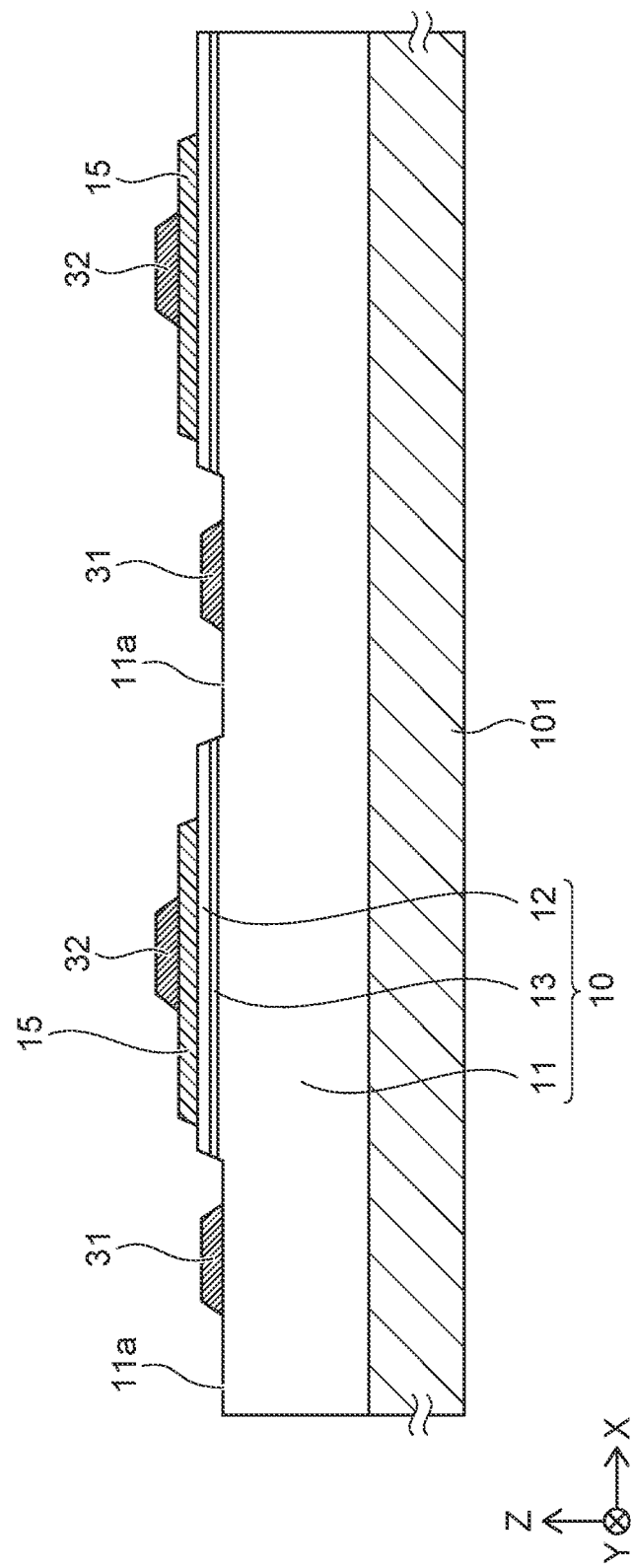
FIG. 16 is a schematic cross-sectional view along line XVI-XVI of FIG. 15.
Figure 17:
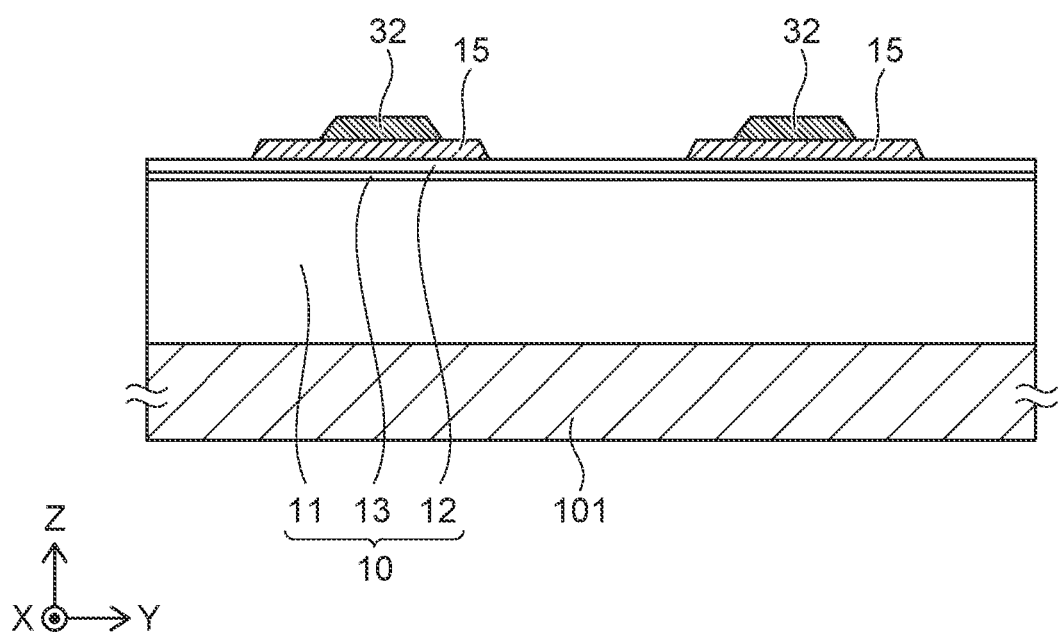
FIG. 17 is a schematic cross-sectional view along line XVII-XVII of FIG. 15.

After the second masks 92 are removed, the method for manufacturing the light-emitting element of the embodiment includes a process of forming n-side electrodes 31 at the n-side exposed parts 11a as shown in FIGS. 15 and 16. The n-side electrodes 31 are formed at the n-side exposed parts 11a and are electrically connected with the n-side layer 11. As shown in FIGS. 15 and 17, after the second masks 92 are removed, the method for manufacturing the light-emitting element of the embodiment includes a process of forming the p-side electrodes 32 on the light-transmitting conductive films 15. The p-side electrodes 32 are electrically connected with the p-side layers 12 via the light-transmitting conductive films 15.

For example, the n-side electrodes 31 and the p-side electrodes 32 are formed by sputtering and/or vapor deposition. The n-side electrodes 31 and the p-side electrodes 32 each can be, for example, a single-layer metal layer including Ti, Rh, Au, Pt, Al, Ag, or Ru, or can have a stacked structure including at least two such metal layers. The n-side electrodes 31 and the p-side electrodes 32 can be simultaneously formed using the same material.

According to the embodiment as shown in FIG. 9, the second masks 92 are formed at positions at which the second masks 92 are separated from the outer edges 15o of the light-transmitting conductive film 15 defining the openings 15a in the top view. By using the second masks 92 to remove the light-transmitting conductive film 15 not covered with the second masks 92, the light-transmitting conductive film 15 is formed to be separated in multiple regions corresponding to the positions of the second masks 92. As shown in FIG. 15, the multiple light-transmitting conductive films 15 each are formed at positions separated from outer edges 11o of the n-side exposed parts 11a in the top view. The distance between the light-transmitting conductive film 15 to which a potential is applied and the n-side exposed part 11a to which a potential is applied can be increased thereby. As a result, the reliability of the light-emitting element can be increased because electrostatic damage of the light-emitting element occurs less easily.

For example, in the process of forming the n-side exposed parts 11a, after the light-transmitting conductive film 15 and the semiconductor structure body 10 are removed, the wafer W is further immersed in an etchant so that the etchant penetrates to the light-transmitting conductive film 15 positioned below the first mask 91. A portion of the light-transmitting conductive film 15 positioned below the first mask 91 is removed thereby, and the distance between the n-side exposed part 11a and the outer edge of the light-transmitting conductive film 15 can be increased. However, the shape of the outer edge of the light-transmitting conductive film 15 formed by this method tends to become nonuniform, and fluctuation of the performance of the light-emitting element that is manufactured may occur. According to the embodiment, the fluctuation of the performance of the light-emitting element can be reduced because the nonuniformity of the shape of the outer edge of the light-transmitting conductive film 15 can be reduced.

Electrostatic damage of the light-emitting element occurs less easily as a shortest distance d1 increases between the outer edge 11o of the n-side exposed part 11a and an outer edge 15b of the light-transmitting conductive film 15 facing the outer edge 11o of the n-side exposed part 11a in the top view. However, the surface area of the light-transmitting conductive film 15 is reduced when the shortest distance d1 when referenced to the position of the outer edge 11o of the n-side exposed part 11a is increased. When the surface area of the light-transmitting conductive film 15 is reduced, the region where the current is directly supplied from the light-transmitting conductive film 15 to the A-side layer 12 is reduced, which may substantially reduce the light-emitting region. Accordingly, it is preferable for the shortest distance d1 to be not less than 1 µm and not more than 5 µm to ensure a wider light-emitting region while preventing electrostatic damage of the light-emitting element.

Process of Forming First Reflective Layer

Figure 18:
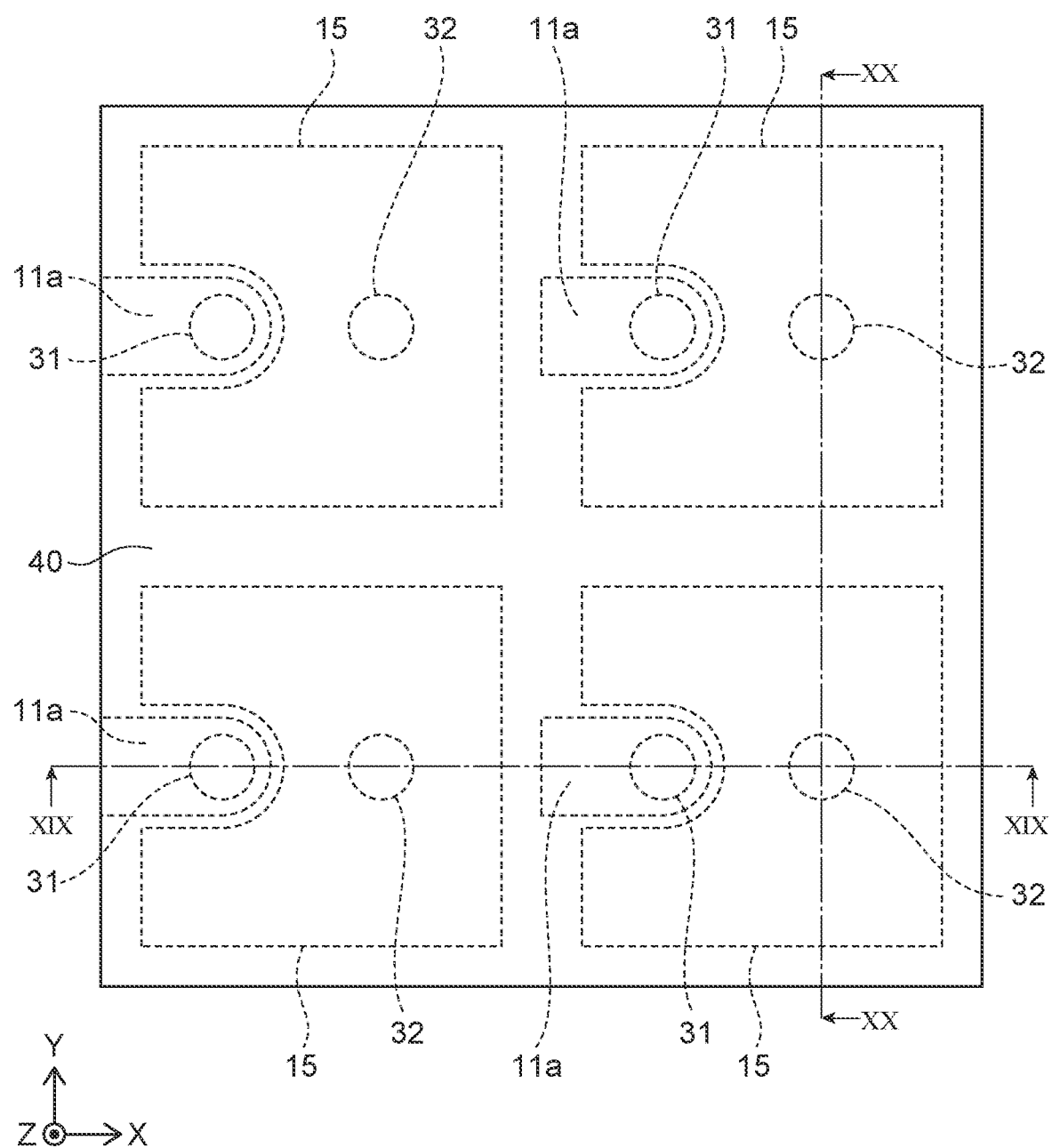
FIG. 18 is a schematic plan view for describing one process of the method for manufacturing the light-emitting element of the embodiment.
Figure 19:
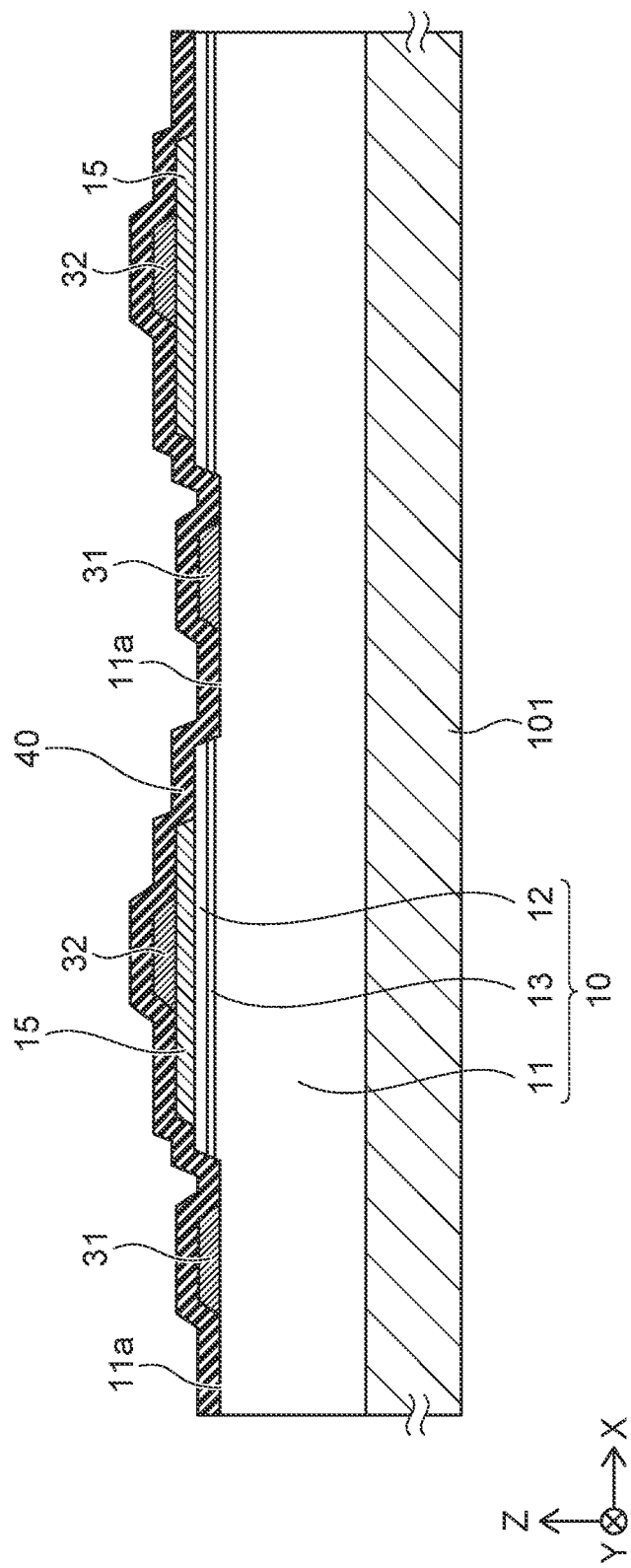
FIG. 19 is a schematic cross-sectional view along line XIX-XIX of FIG. 18.
Figure 20:
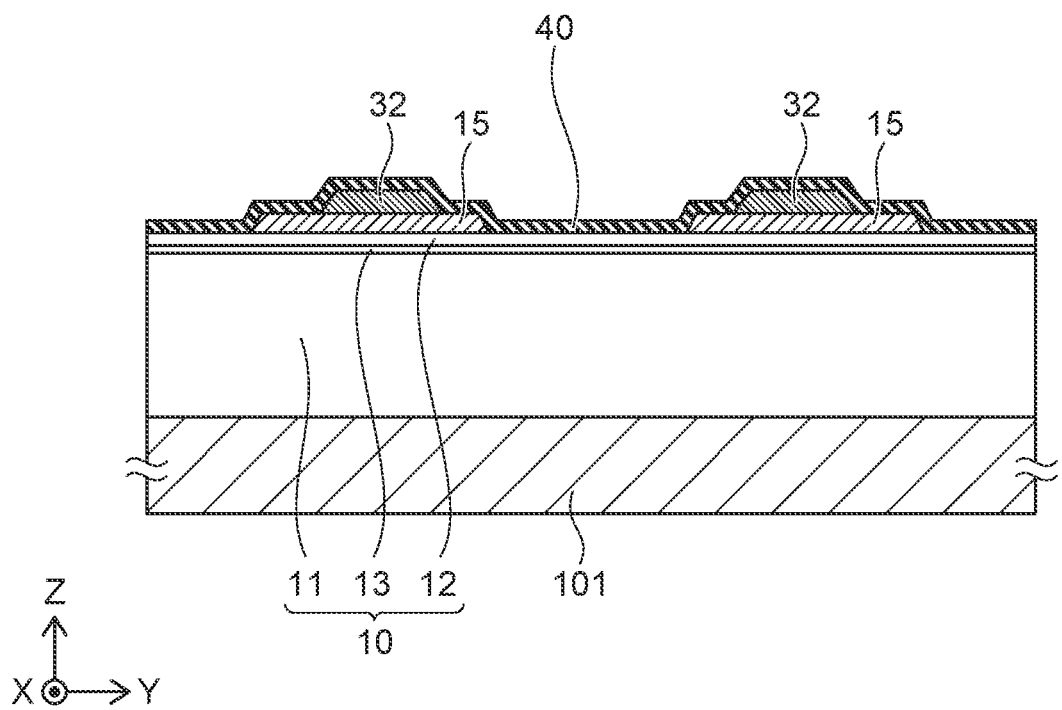
FIG. 20 is a schematic cross-sectional view along line XX-XX of FIG. 18.

After the n-side electrode 31 and the p-side electrode 32 are formed, the method for manufacturing the light-emitting element of the embodiment can include a process of forming a first reflective layer 40 as necessary as shown in FIGS. 18 to 20. The first reflective layer 40 covers the surface of the semiconductor structure body 10 positioned at the side opposite to the surface positioned at the first substrate 101 side. The first reflective layer 40 covers the light-transmitting conductive film 15, the n-side electrode 31, and the p-side electrode 32.

The first reflective layer 40 is reflective to the light emitted by the active layer 13. The first reflective layer 40 includes, for example, a dielectric multilayer film. The dielectric multilayer film includes, for example, a $SiO_2$ layer and a $Nb_2O_5$ layer that are alternately stacked. For example, it is preferable to form the first reflective layer 40 by forming a relatively thick $SiO_2$ layer having a thickness of not less than 100 nm and not more than 500 nm, followed by forming a dielectric multilayer film on the relatively thick $SiO_2$ layer by forming not less than 2 and not more than 6 pairs of layers, so that each pair includes a $Nb_2O_5$ layer having a thickness of not less than 10 nm and not more than 100 nm and a $SiO_2$ layer having a thickness of not less than 10 nm and not more than 100 nm. Good light reflectivity can be obtained by setting the film thickness of each layer and the number of stacks of each layer in the first reflective layer 40 in this manner. For example, the first reflective layer 40 can be formed by forming a $SiO_2$ layer having a thickness of 300 nm, followed by forming, on the $SiO_2$ layer, three pairs of layers, so that each pair is a $Nb_2O_5$ layer having a thickness of 52 nm and a $SiO_2$ layer having a thickness of 83 nm. Materials such as titanium oxide ($TiO_2$), zirconium oxide ($ZrO_2$), aluminum oxide ($Al_2O_3$), aluminum nitride (AlN), etc., can be used as the first reflective layer 40. For example, the first reflective layer 40 is formed by vapor deposition or sputtering.

Process of Forming Third Masks

Figure 21:
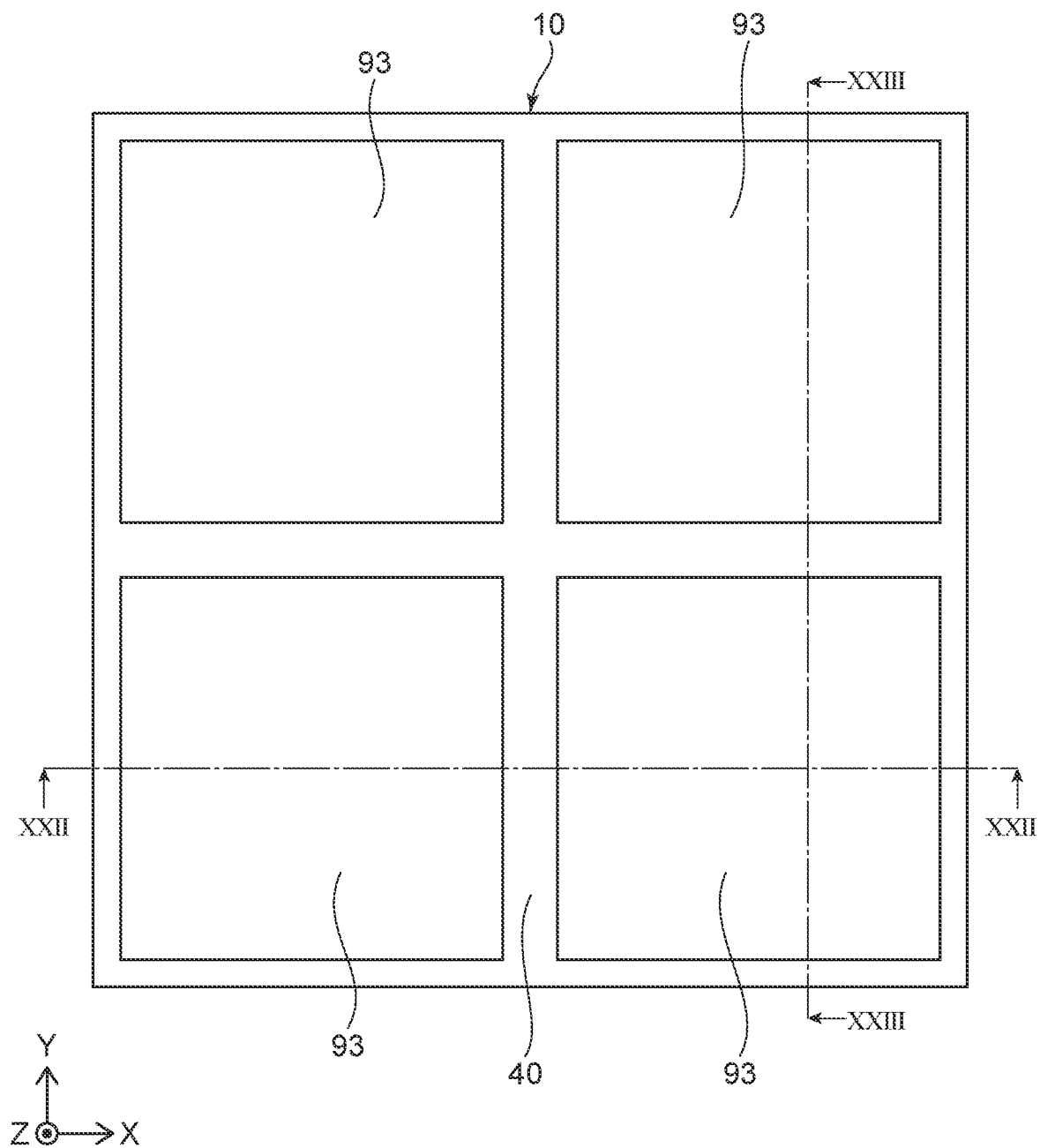
FIG. 21 is a schematic plan view for describing one process of the method for manufacturing the light-emitting element of the embodiment.
Figure 22:
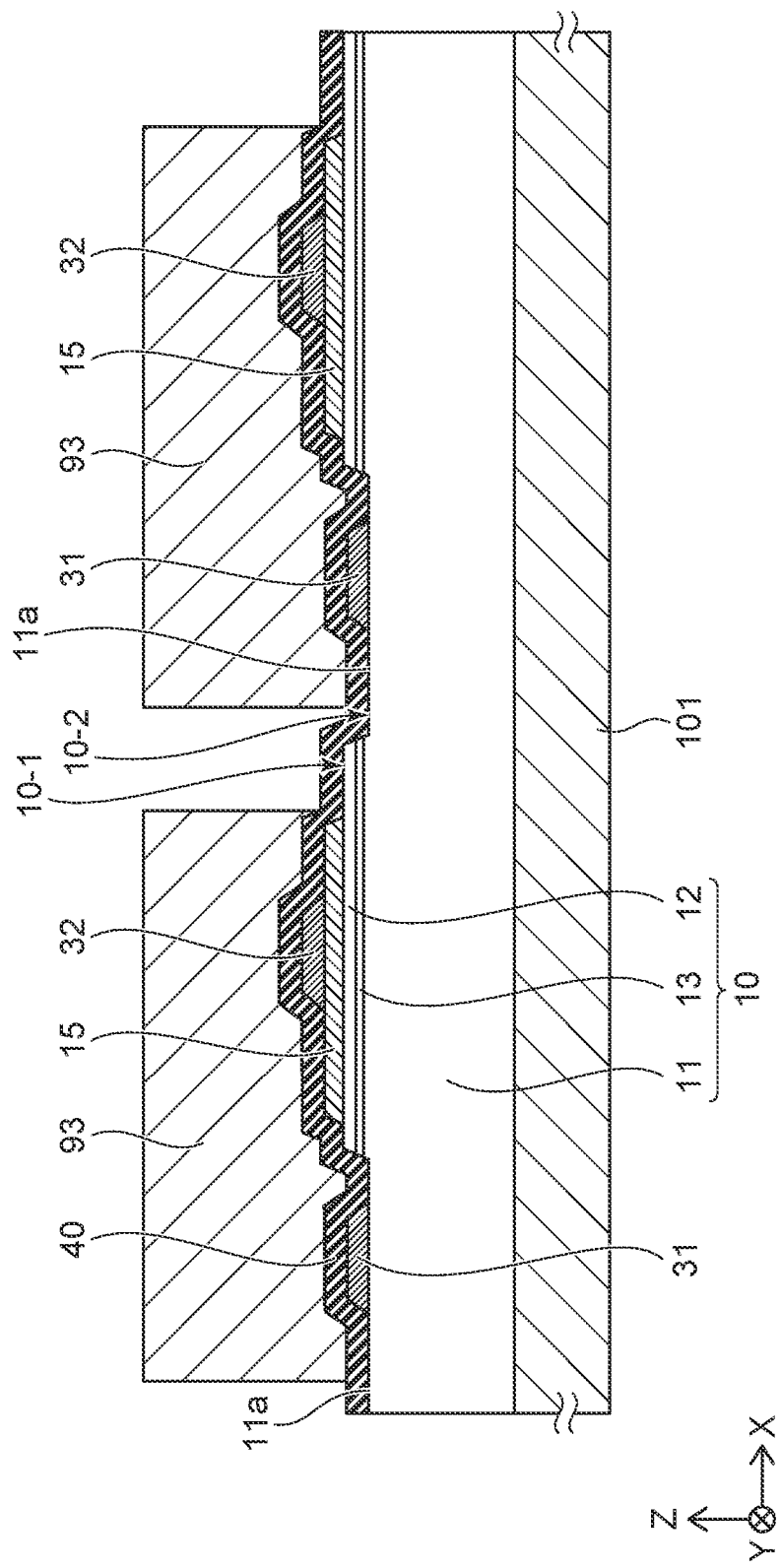
FIG. 22 is a schematic cross-sectional view along line XXII-XXII of FIG. 21.
Figure 23:
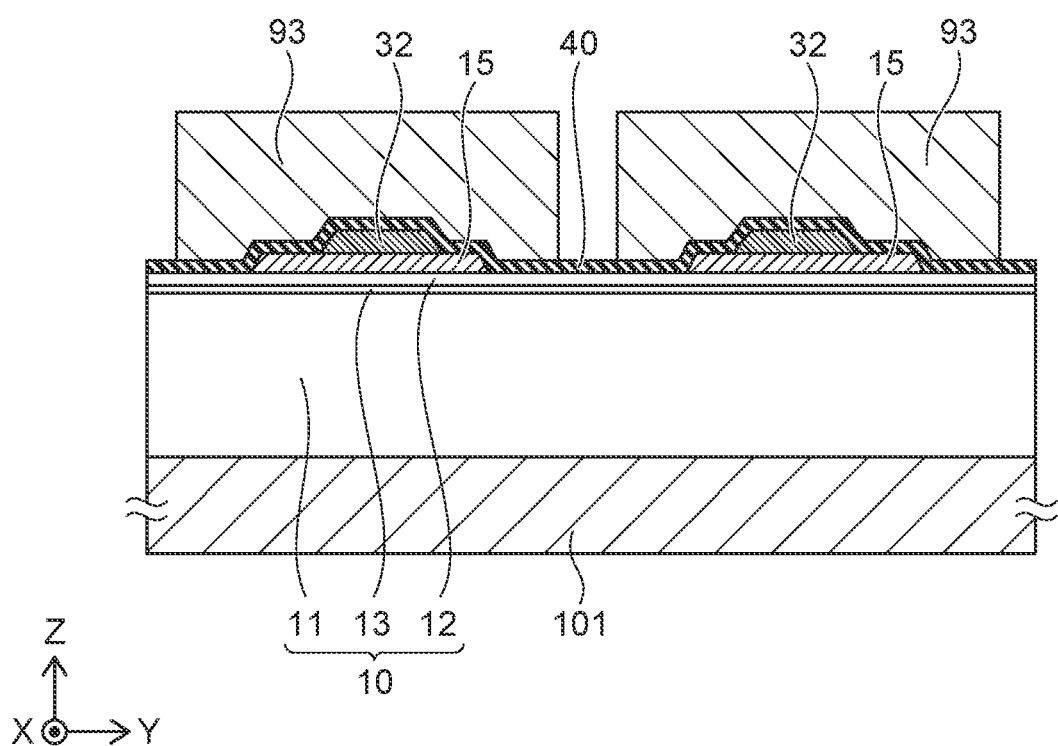
FIG. 23 is a schematic cross-sectional view along line XXIII-XXIII of FIG. 21.

After the process of removing the light-transmitting conductive film 15 not covered with the second masks 92, the method for manufacturing the light-emitting element of the embodiment includes a process of forming third masks 93 on the light-transmitting conductive film 15 and on the semiconductor structure body 10 as shown in FIGS. 21 to 23. The third masks 93 are formed also on the n-side electrodes 31 and on the p-side electrodes 32. In the case where the first reflective layer 40 is formed, the third masks 93 are formed on the first reflective layer 40. The case where the first reflective layer 40 is formed will now be described.

The third masks 93 can include, for example, a photoresist. The multiple third masks 93 that are separated from each other in the first and second directions X and Y in the top view are formed by exposing and developing. As shown in FIGS. 21 to 23, the first reflective layer 40 that is positioned between the third masks 93 next to each other in the first and second directions X and Y is exposed from the third masks 93.

Figure 24:
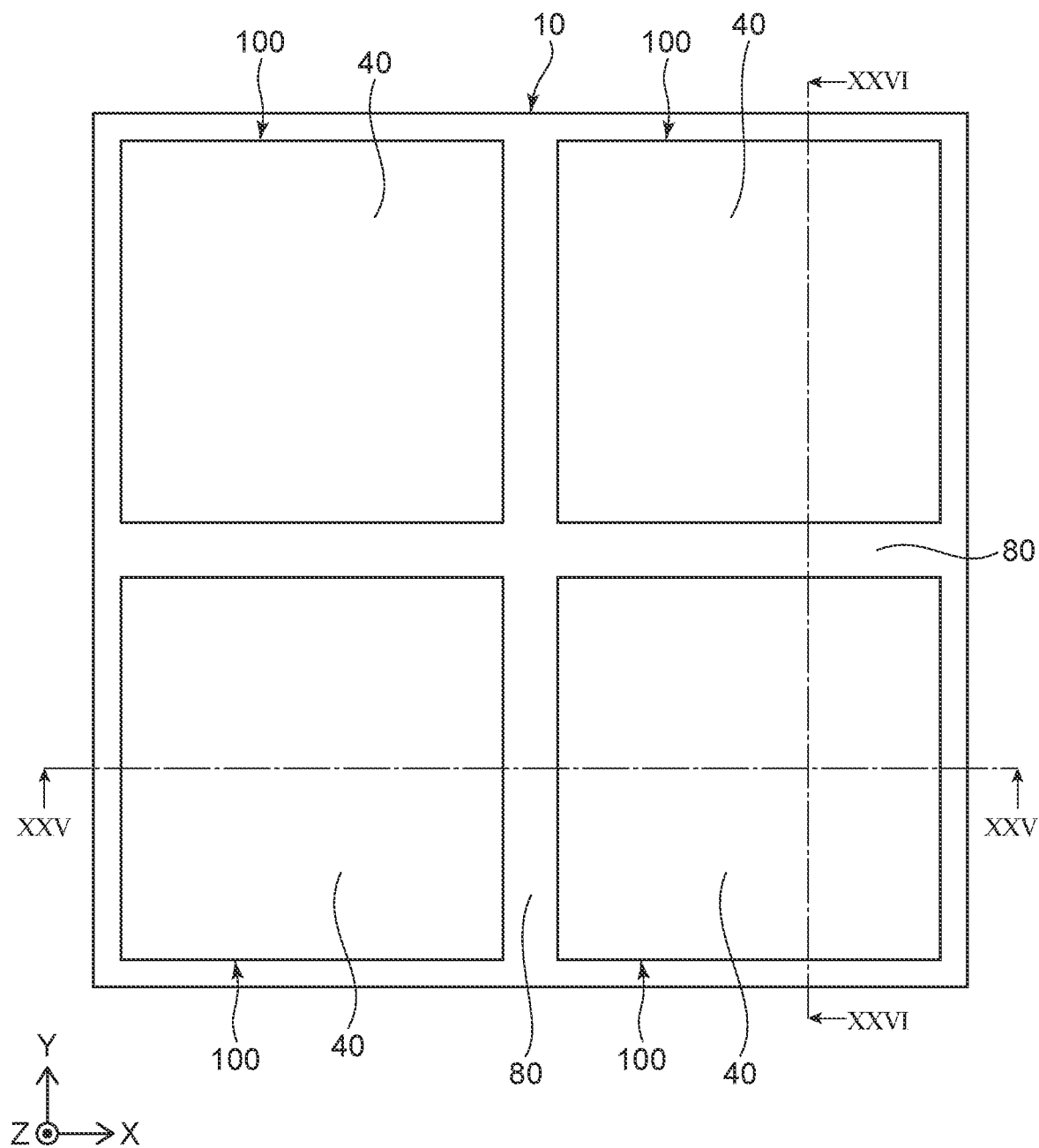
FIG. 24 is a schematic plan view for describing one process of the method for manufacturing the light-emitting element of the embodiment.
Figure 25:
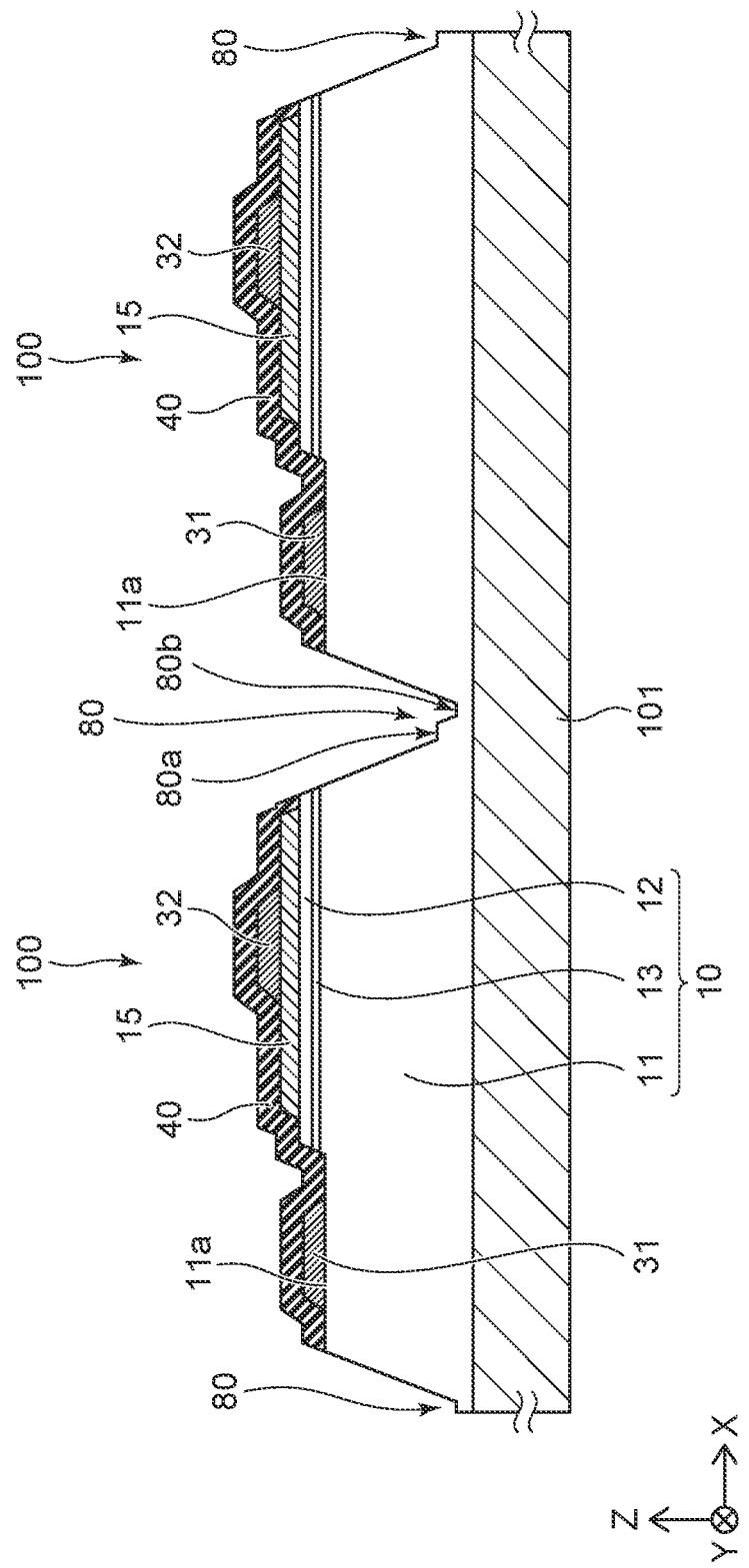
FIG. 25 is a schematic cross-sectional view along line XXV-XXV of FIG. 24.
Figure 26:
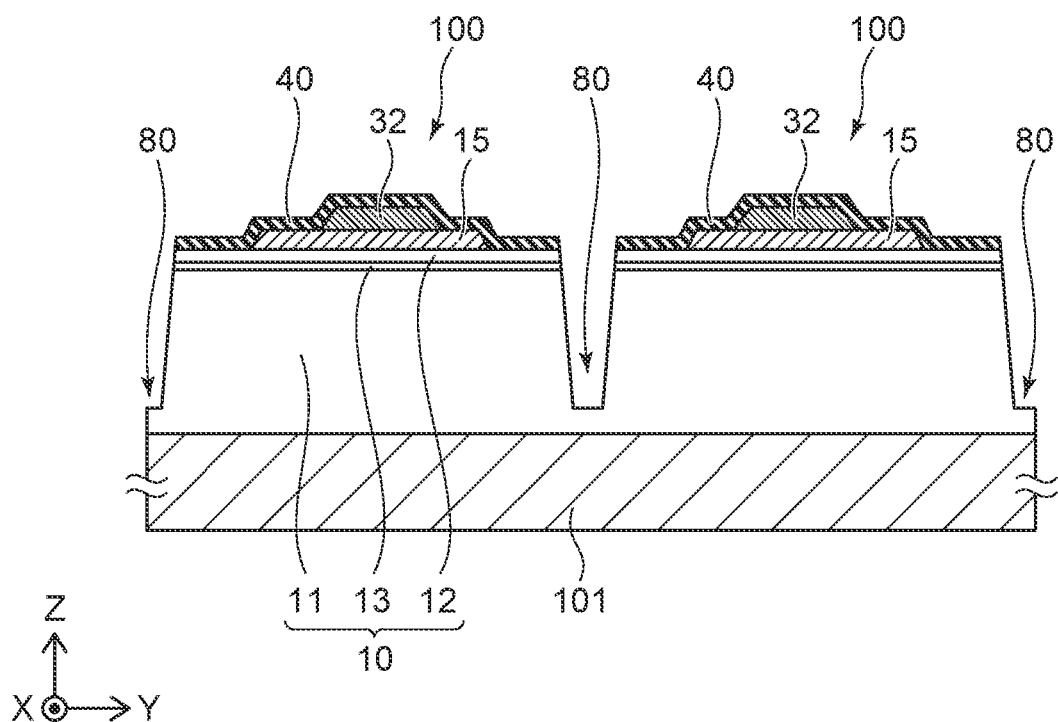
FIG. 26 is a schematic cross-sectional view along line XXVI-XXVI of FIG. 24.

Process of Removing Semiconductor Structure Body in Region not Overlapping Third Masks After the process of forming the third masks 93, the method for manufacturing the light-emitting element of the embodiment includes a process of removing the semiconductor structure body 10 in a region not overlapping the third masks 93 in the top view to form a groove 80 in the semiconductor structure body 10 as shown in FIGS. 24 to 26. The groove 80 extends in the first and second directions X and Y and divides the semiconductor structure body 10 into multiple element parts 100 in the first and second directions X and Y. The groove 80 surrounds the outer edge of the element part 100 in the top view.

The groove 80 is formed in the semiconductor structure body 10 by removing the first reflective layer 40 and the semiconductor structure body 10 in the region between the third masks 93 next to each other in the first and second directions X and Y to expose the n-side layer 11. As shown in FIGS. 25 and 26, the n-side layer 11, the active layer 13, and the p-side layer 12 are exposed at the lateral surface of the groove 80.

In the process of forming the groove 80, for example, the first reflective layer 40 and the semiconductor structure body 10 are removed by dry etching. For example, RIE is an example of dry etching. The process of forming the groove 80 by RIE includes a process of removing the first reflective layer 40 exposed from the third masks 93 by a first etching using a first gas including fluorine, and a process of removing, after the first reflective layer 40 is removed, the semiconductor structure body 10 exposed from the third masks 93 by a second etching using a second gas including chlorine. The first gas includes, for example, $CF_4$ and $CHF_3$. The second gas includes, for example, $Cl_2$ and $SiCl_4$.

As shown in FIGS. 25 and 26, by forming the groove 80, the element part 100 in which the first reflective layer 40 is not located at substantially the entire surface of the lateral surface of the active layer 13 can be formed. Accordingly, the light extraction efficiency to the outside from the lateral surface of the active layer 13 can be increased. As shown in FIG. 25, the first reflective layer 40 is formed at the lateral surface of the active layer 13 that is continuous from the n-side exposed part 11a.

As shown in FIG. 22, the semiconductor structure body 10 in the region between the adjacent third masks 93 includes a first part 10-1 that includes the n-side layer 11, the active layer 13, and the p-side layer 12, and a second part 10-2 that includes only the n-side layer 11. A step exists between the first part 10-1 and the second part 10-2. Accordingly, as shown in FIG. 25, a step is formed in the bottom surface defining the groove 80 formed by removing the semiconductor structure body 10. In the groove 80, the depth of a second region 80b formed by etching the second part 10-2 is greater than the depth of a first region 80a formed by etching the first part 10-1. The depth difference between the first region 80a and the second region 80b is, for example, not less than 0.5 μm and not more than 5 μm.

For example, the groove 80 does not extend through the semiconductor structure body 10 and does not reach the first substrate 101. The groove 80 may be formed to extend through the semiconductor structure body 10 and reach the first substrate 101.

According to the embodiment, the process of forming the first mask 91 for patterning the light-transmitting conductive film 15 and the process of forming the second masks 92 are performed before the process of forming the groove 80. By exposing and developing the first and second masks 91 and 92 on the wafer that has little unevenness before forming the groove 80, the accuracy of the patterning of the first mask 91 having the mask opening 91a and the mutually-separated multiple second masks 92 can be increased. As a result, the accuracy of the patterning of the light-transmitting conductive film 15 can be increased.

According to the embodiment as shown in FIG. 15, in the top view, the n-side exposed part 11a includes an extension portion 11b that extends inward into the light-transmitting conductive film 15 from the position of the outer side of the light-transmitting conductive film 15 and is positioned between the light-transmitting conductive film 15. The n-side electrode 31 is formed at the extension portion 11b. According to such a configuration, compared to a configuration in which the n-side exposed part 11a extends in a straight line in the first direction X or the second direction Y and faces one outer edge of the light-transmitting conductive film 15 extending in the first direction X or the second direction Y in the top view, it is easy to reduce the surface area of the region between the outer edge of the light-transmitting conductive film 15 and the outer edge of the n-side exposed part 11a (the region without the light-transmitting conductive film 15). The surface area of the light-transmitting conductive film 15 can be increased thereby, and the light-emitting region can be easily increased.

Figure 27:
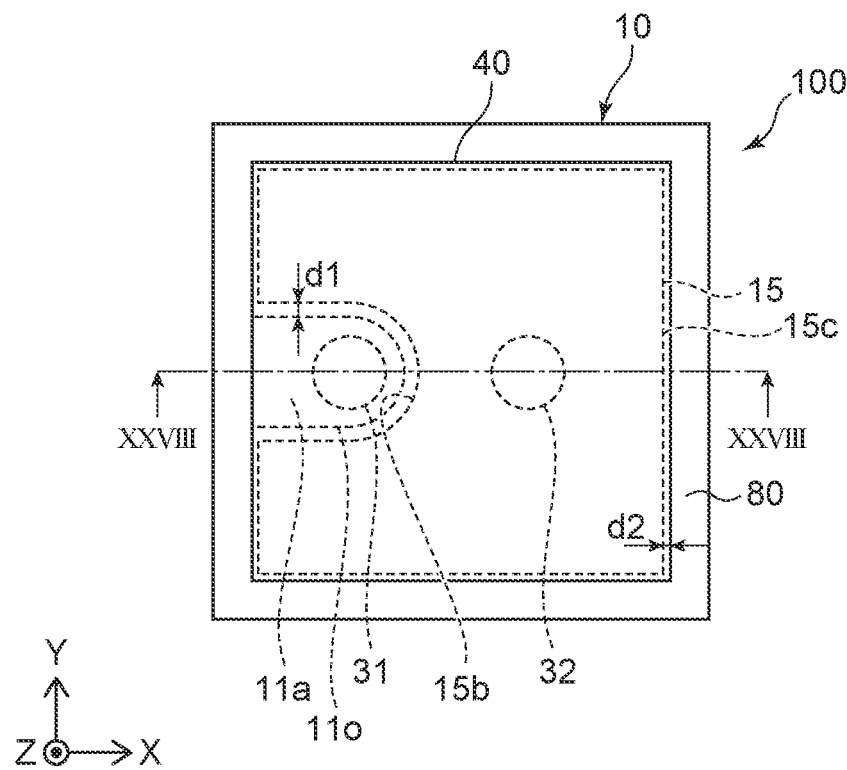
FIG. 27 is a schematic plan view for describing one process of the method for manufacturing the light-emitting element of the embodiment.
Figure 28:
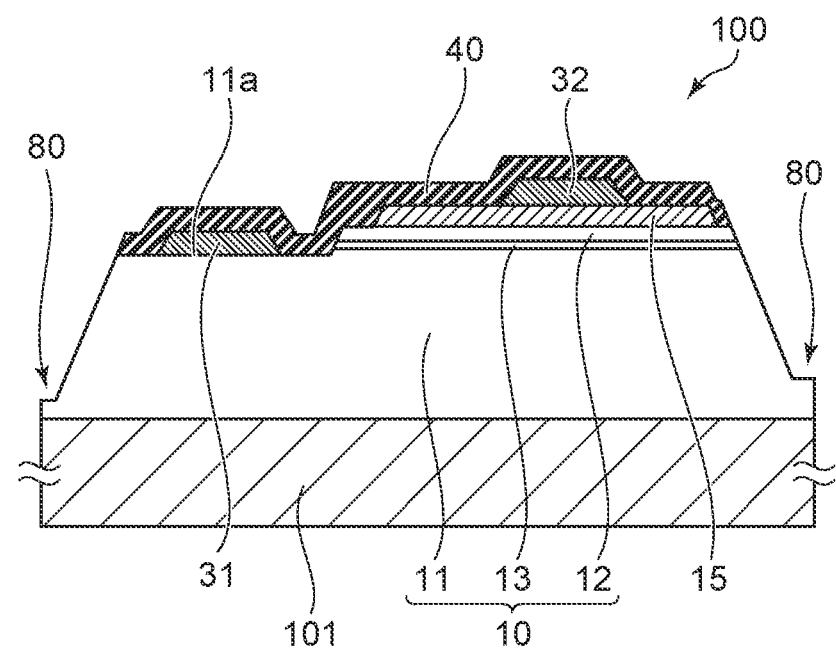
FIG. 28 is a schematic cross-sectional view along line XXVIII-XXVIII of FIG. 27.

FIGS. 27 and 28 show one element part 100.

In the process of removing the semiconductor structure body 10 exposed from the third mask 93 to form the groove 80, it is preferable to remove the semiconductor structure body 10 so that the shortest distance d1 between the outer edge 11o of the n-side exposed part 11a and the outer edge 15b of the light-transmitting conductive film 15 facing the outer edge 11o of the n-side exposed part 11a is greater than a shortest distance d2 between the groove 80 and an outer edge 15c of the light-transmitting conductive film facing the groove 80 in the top view. Accordingly, a wide light-emitting region can be easily ensured while preventing electrostatic damage of the light-emitting element. For example, the shortest distance d1 can be set to be not less than 1 μm, and the shortest distance d2 can be set to be not more than 1 μm. For example, the difference between the shortest distance d1 and the shortest distance d2 is not less than 0.1 μm and not more than 1 μm.

Figure 29:
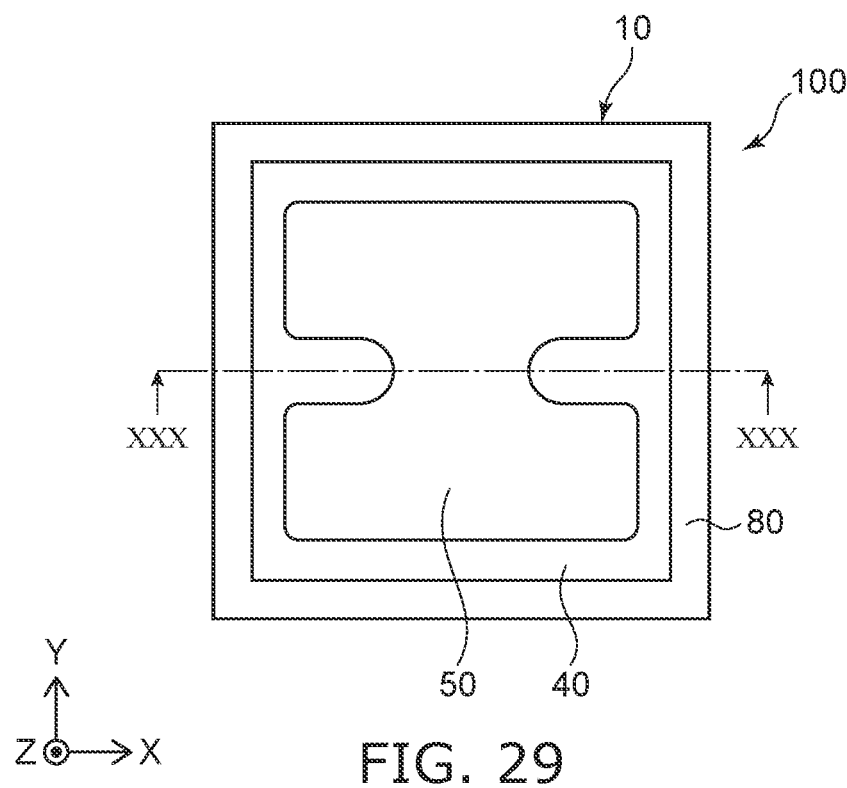
FIG. 29 is a schematic plan view for describing one process of the method for manufacturing the light-emitting element of the embodiment.

The method for manufacturing the light-emitting element of the embodiment can further include, after the multiple element parts 100 are divided by the groove 80, the processes shown in FIG. 29 and subsequent drawings. One element part 100 is shown in FIG. 29 and subsequent drawings as well.

Figure 30:
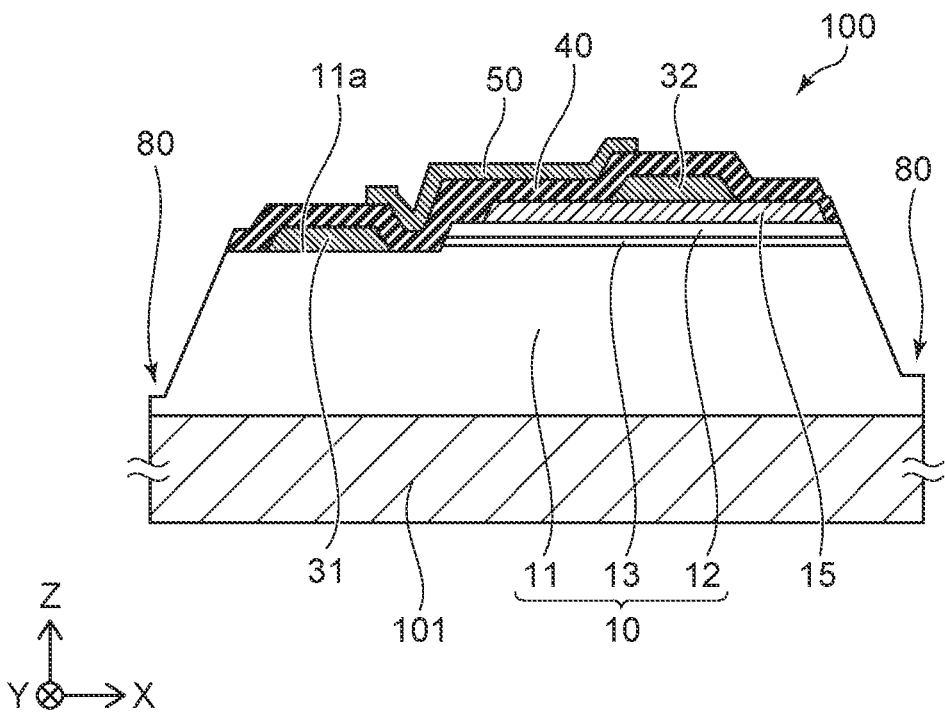
FIG. 30 is a schematic cross-sectional view along line XXX-XXX of FIG. 29.

As shown in FIGS. 29 and 30, a second reflective layer 50 is formed on the first reflective layer 40. By forming the second reflective layer 50, the light from the active layer 13 that passes through the first reflective layer 40 can be reflected, and the light extraction efficiency can be increased. For example, the second reflective layer 50 is formed by sputtering. The second reflective layer 50 is, for example, a metal layer. The second reflective layer 50 includes, for example, an Al layer, a Ti layer, or a stacked structure of an Al layer and a Ti layer.

Figure 31:
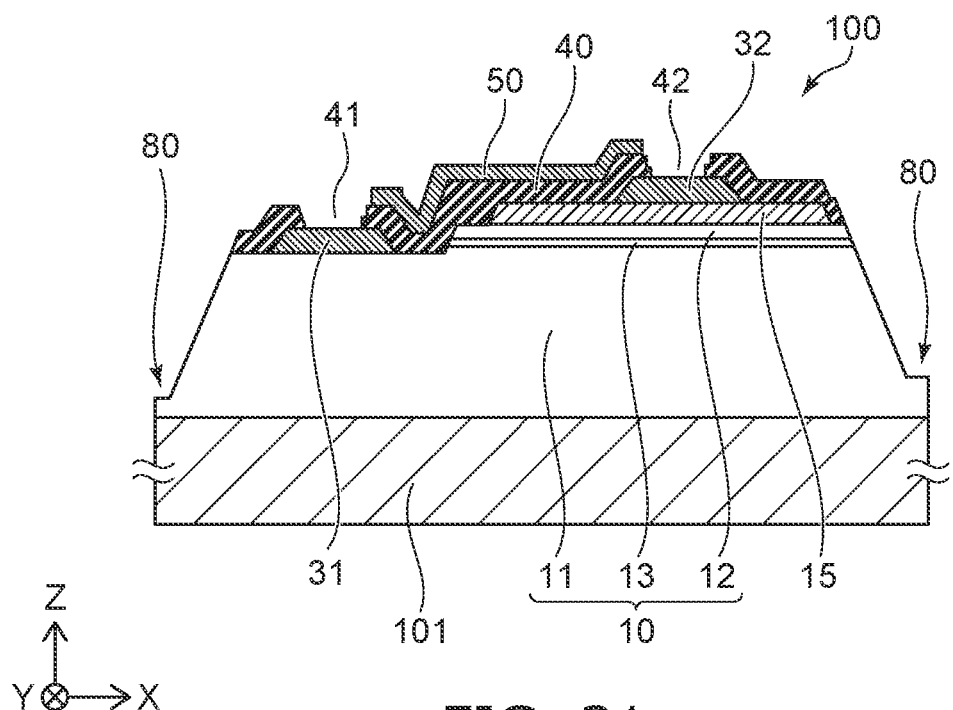
FIG. 31 and FIG. 32 are schematic cross-sectional views for describing one process of the method for manufacturing the light-emitting element of the embodiment.

Then, as shown in FIG. 31, a first opening 41 that exposes a portion of the n-side electrode 31 and a second opening 42 that exposes a portion of the p-side electrode 32 are formed in the first reflective layer 40. For example, the first opening 41 and the second opening 42 are simultaneously formed using RIE.

Figure 32:
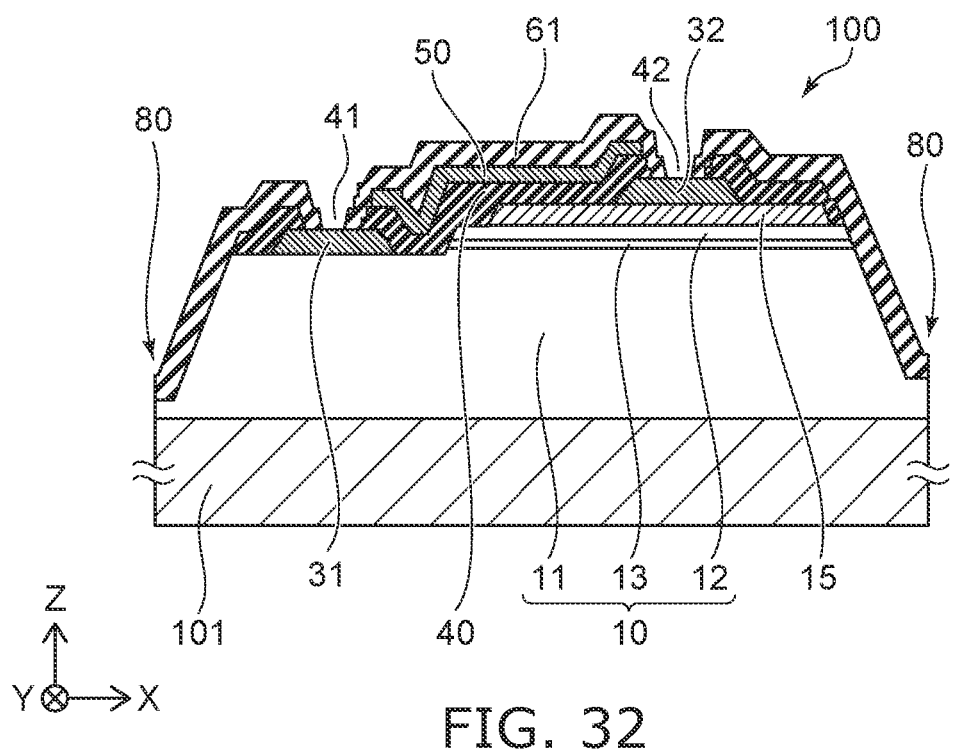

Continuing as shown in FIG. 32, an insulating layer 61 that covers the first reflective layer 40 and the second reflective layer 50 is formed. The insulating layer 61 covers the lateral surface of the first reflective layer 40 defining the first opening 41, the lateral surface of the first reflective layer 40 defining the second opening 42, and the lateral surface of the semiconductor structure body 10 defining the groove 80. The insulating layer 61 is, for example, a silicon oxide layer. The lateral surface of the semiconductor structure body 10 is covered with the insulating layer 61. For example, the insulating layer 61 is formed by sputtering, CVD, etc.

Figure 33:
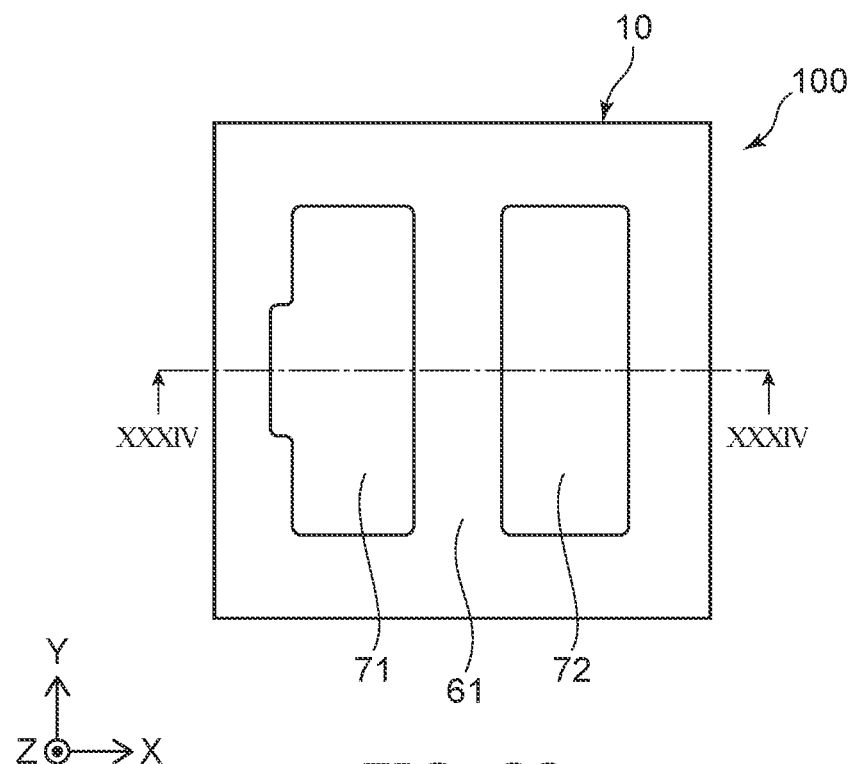
FIG. 33 is a schematic plan view for describing one process of the method for manufacturing the light-emitting element of the embodiment.
Figure 34:
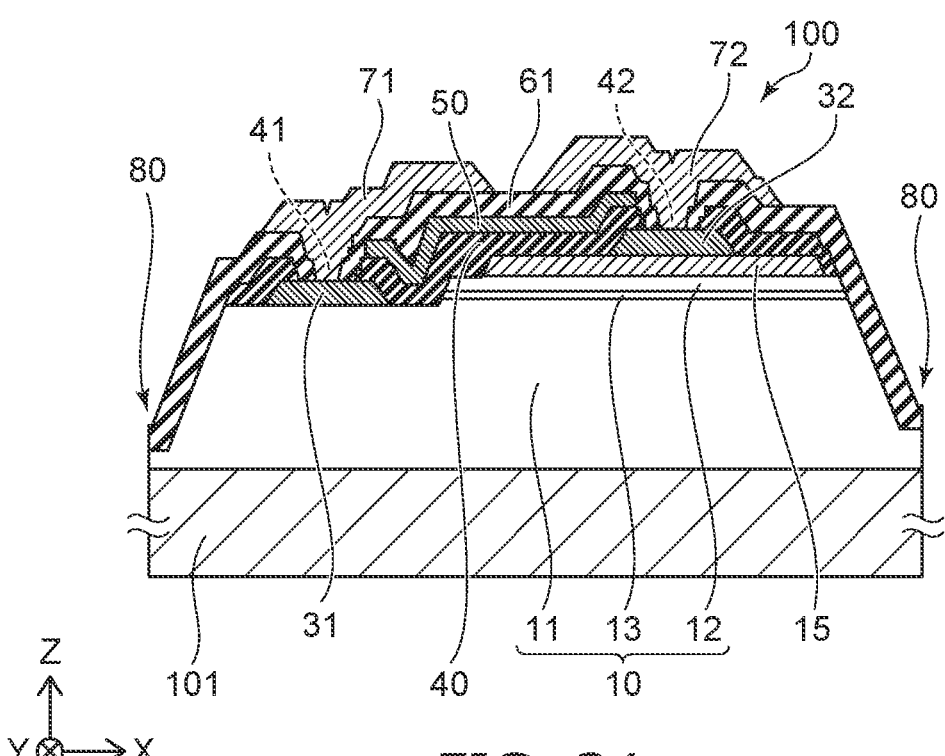
FIG. 34 is a schematic cross-sectional view along line XXXIV-XXXIV of FIG. 33.

Then, as shown in FIGS. 33 and 34, a first conductive member 71 is formed in the first opening 41, and a second conductive member 72 is formed in the second opening 42. The first conductive member 71 contacts the n-side electrode 31. The second conductive member 72 contacts the p-side electrode 32. The first conductive member 71 also is formed on the insulating layer 61 at the periphery of the first opening 41. The second conductive member 72 also is formed on the insulating layer 61 at the periphery of the second opening 42. The first conductive member 71 and the second conductive member 72 are separated from each other on the insulating layer 61. The thicknesses of the first and second conductive members 71 and 72 are, for example, not less than 0.1 µm and not more than 5 µm. In the top view, the first conductive member 71 and the second conductive member 72 are, for example, substantially rectangular, and the lengths of the long sides are not less than 10 µm and not more than 100 µm. For example, the first conductive member 71 is a cathode electrode, and the second conductive member 72 is an anode electrode.

For example, the first conductive member 71 and the second conductive member 72 are simultaneously formed by sputtering. The first conductive member 71 and the second conductive member 72 each include, for example, a Ti layer, a Rh layer, a Au layer, or a stacked structure of two of these layers.

When a dielectric multilayer film is used as the first reflective layer 40, for example, a $Nb_2O_5$ layer can be used to form a dielectric multilayer film having a high reflectance for the light emitted by the active layer 13. However, there is a risk that the $Nb_2O_5$ layer may allow a leakage current, which may degrade the reliability of the light-emitting element. According to the embodiment, the insulating layer 61 is formed between the first reflective layer 40 and the first conductive member 71 and between the first reflective layer 40 and the second conductive member 72, so that shorts between the first conductive member 71 and the second conductive member 72 via the first reflective layer 40 can be prevented even when a $Nb_2O_5$ layer is included as a film of the dielectric multilayer film. Therefore, the light extraction efficiency can be increased without degrading the reliability of the light-emitting element.

The insulating layer 61 is formed between the second reflective layer 50 and the first conductive member 71 and between the second reflective layer 50 and the second conductive member 72, so that shorts between the first conductive member 71 and the second conductive member 72 via the second reflective layer 50 can be prevented even when the second reflective layer 50 is a metal layer. Therefore, the light extraction efficiency can be increased without degrading the reliability of the light-emitting element.

Thereafter, the processes shown in FIGS. 35 to 41 are continued. The vertical orientation of the element part 100 in FIGS. 35 to 41 is the opposite of that of the drawings up to FIG. 34.

Figure 35:
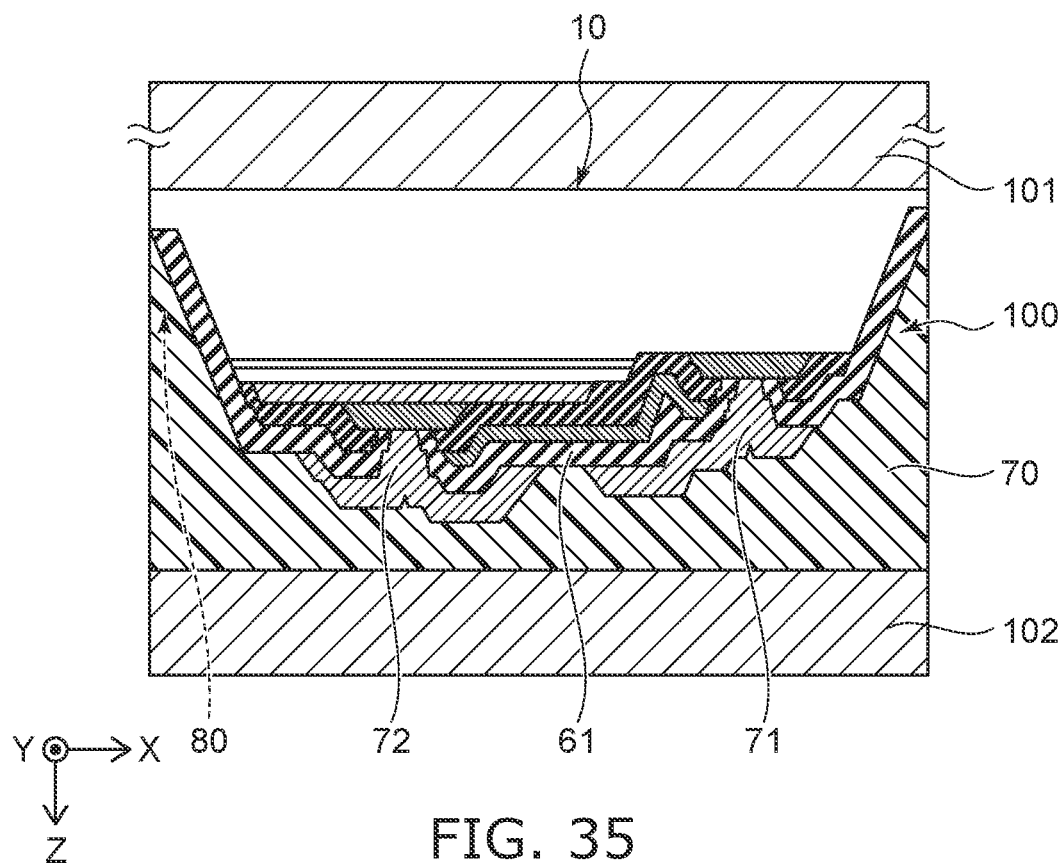
FIGS. 35-41 are schematic cross-sectional views for describing one process of the method for manufacturing the light-emitting element of the embodiment.

In the process shown in FIG. 35, the semiconductor structure body 10 and a second substrate 102 are bonded via a resin member 70. The resin member 70 covers the first conductive member 71, the second conductive member 72, and the insulating layer 61 and is formed inside the groove 80. The resin member 70 mainly includes, for example, an epoxy resin, an acrylic resin, or a polyimide resin. Similarly to the first substrate 101, for example, the second substrate 102 can include a substrate of sapphire, spinel, SiC, ZnS, ZnO, GaAs, Si, etc.

Figure 36:
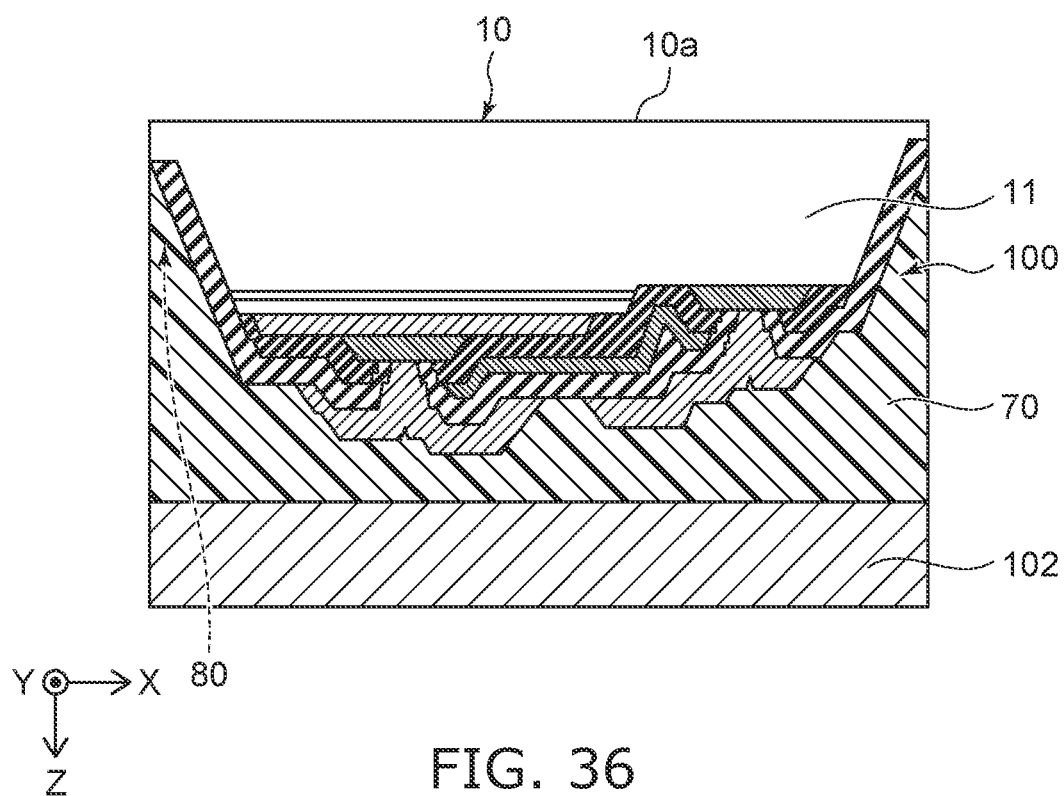

As shown in FIG. 36, after the semiconductor structure body 10 and the second substrate 102 are bonded, the first substrate 101 is removed to expose a first surface 10a of the semiconductor structure body 10 that was in contact with the first substrate 101. For example, the first substrate 101 is removed by a method such as LLO (Laser Lift Off), polishing, grinding etching, etc.

The first surface 10a includes, for example, GaN, and the laser light used in the LLO is, for example, deep ultraviolet light. The first substrate 101 is detached from the first surface 10a by the irradiation of the laser light sublimating the Ga in the GaN. At this time, the first surface 10a exists over the entire surface of the first substrate 101 in the LLO because a portion of the semiconductor structure body 10 remains between the first substrate 101 and the bottom surface of the groove 80 in the process of forming the groove 80 shown in FIGS. 25 and 26. Accordingly, it is easier to detach the first substrate 101 by LLO.

Figure 37:
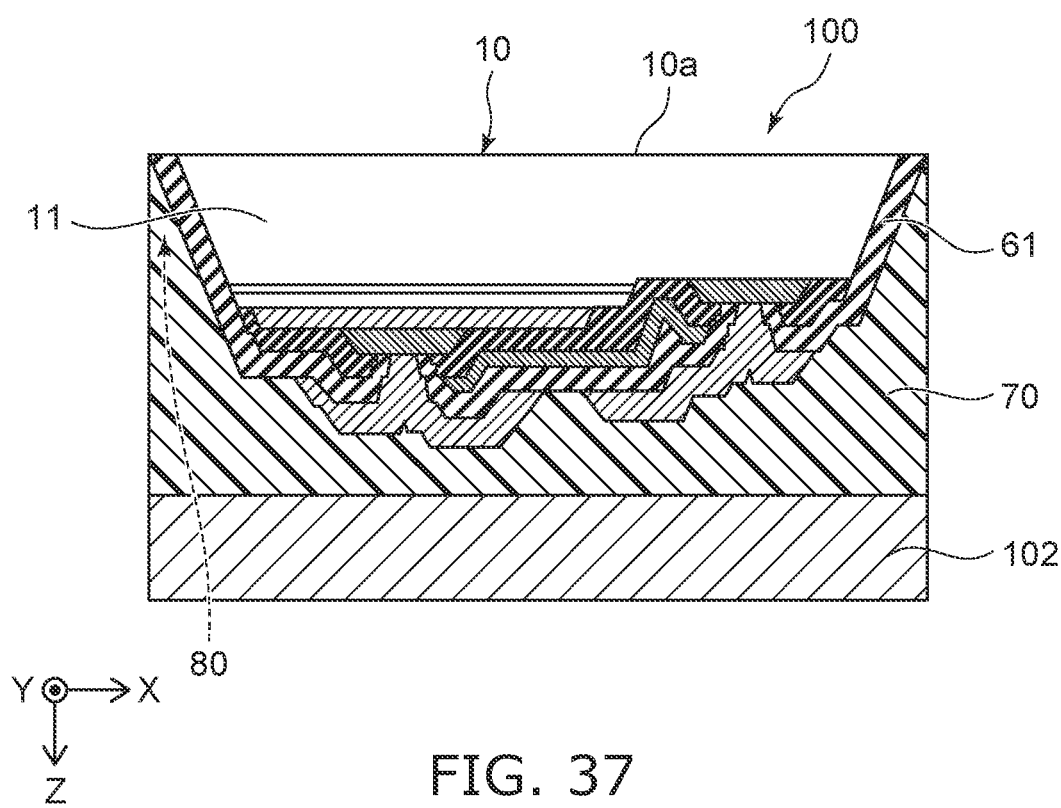

Then, the semiconductor structure body 10 is removed from the exposed first surface 10a side. For example, CMP (Chemical Mechanical Polishing) is used to remove the semiconductor structure body 10. By performing this process, for example, the first surface 10a has a maximum difference between highs and lows of not less than about 1 nm and not more than about 30 nm. As shown in FIG. 37, the semiconductor structure body 10 is removed from the first surface 10a side so that the semiconductor structure body 10 positioned in the groove 80 is removed. The element part 100 is singulated by removing the semiconductor structure body 10 positioned in the groove 80.

Figure 38:
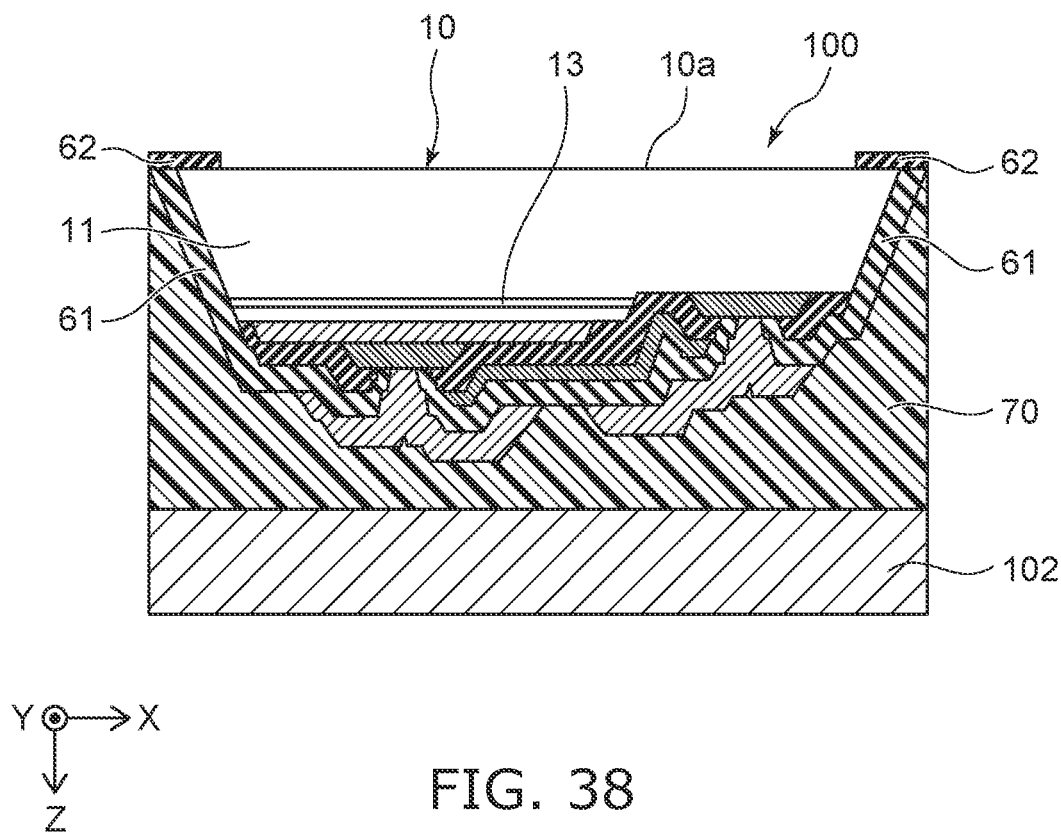

Then, as shown in FIG. 38, a first protective film 62 that covers the outer perimeter portion of the first surface 10a is formed. The first protective film 62 also covers the end portion at the first surface 10a side of the insulating layer 61 covering the lateral surface of the n-side layer 11. The first protective film 62 is transmissive to the light emitted by the active layer 13. The first protective film 62 is, for example, a silicon oxide film. For example, the first protective film 62 is formed over the entire surface of the first surface 10a by sputtering, after which the first protective film 62 other than the first protective film 62 at the outer perimeter portion of the first surface 10a is removed by RIE using a not-illustrated resist mask. Here, "the outer perimeter portion of the first surface 10a" means, for example, a region of the first surface 10a within 10 μm from the outer edge of the first surface 10a in the top view.

Figure 39:
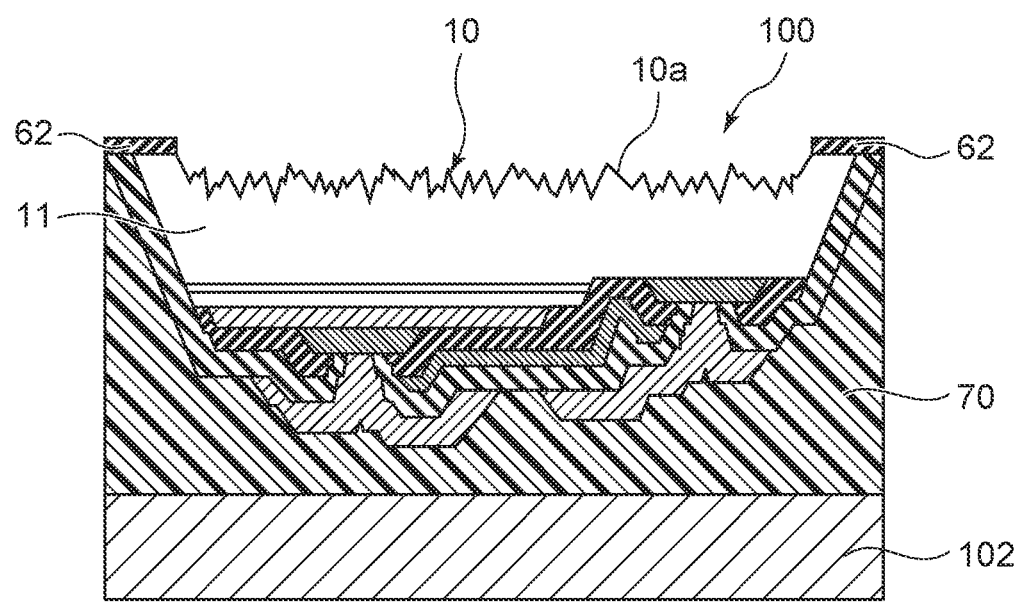

After the first protective film 62 is formed, a rough surface that includes an unevenness is formed in the first surface 10a as shown in FIG. 39 by roughening the first surface 10a not covered with the first protective film 62. The first surface 10a is a major extraction surface of the light of the light-emitting element, and the light extraction efficiency of the light-emitting element can be increased by forming a rough surface in the first surface 10a. The light extraction efficiency of the light-emitting element can be increased by, for example, setting the maximum difference between highs and lows of the unevenness of the first surface 10a to be not less than about 1 μm and not more than about 3 μm. For example, the first surface 10a is roughened by RIE using a gas including chlorine, or by wet etching using an alkaline solution such as TMAH (tetramethylammonium hydroxide), etc.

If the entire surface of the first surface 10a is roughened, chipping of the n-side layer 11 easily occurs at the outer perimeter portion of the first surface 10a. According to the embodiment, a region of the outer perimeter portion of the first surface 10a that is not roughened can be formed because the outer perimeter portion of the first surface 10a that continues from the lateral surface of the n-side layer 11 is covered with the first protective film 62. As a result, the occurrence of chipping of the n-side layer 11 at the outer perimeter portion of the first surface 10a can be reduced. It is preferable to roughen the first surface 10a in a state in which the resist mask used when removing the first protective film 62 other than the first protective film 62 at the outer perimeter portion of the first surface 10a remains on the first protective film 62 at the outer perimeter portion of the first surface 10a. As a result, an unroughened region can be easily formed in the first surface 10a at the outer perimeter portion of the n-side layer 11.

Figure 40:
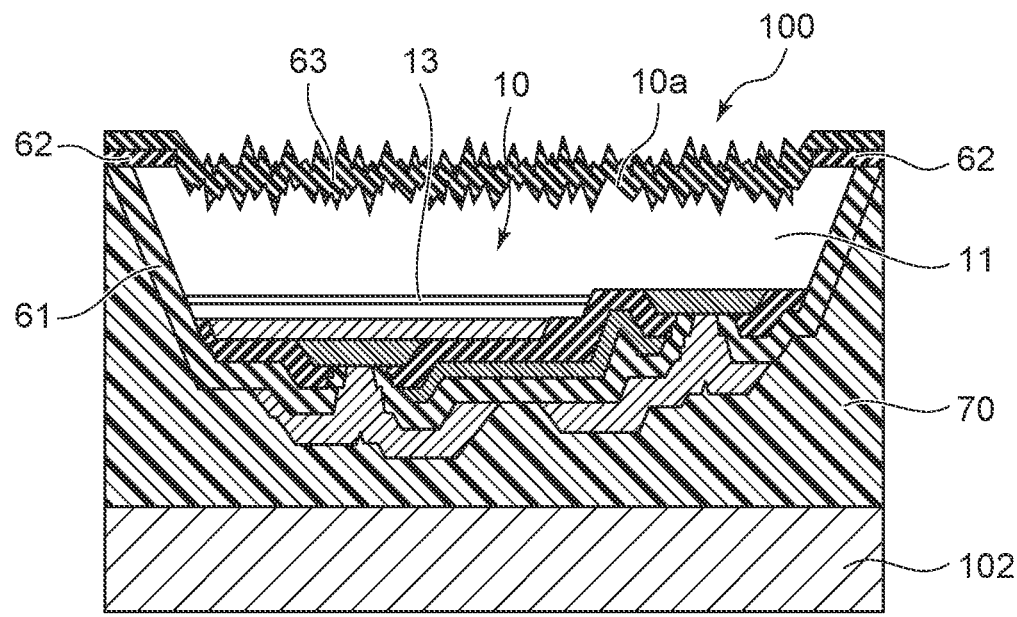

Then, as shown in FIG. 40, a second protective film 63 is formed at the roughened first surface 10a. The second protective film 63 also is formed on the first protective film 62. The second protective film 63 is transmissive to the light emitted by the active layer 13. The second protective film 63 is, for example, a silicon oxide film. For example, the second protective film 63 is formed by sputtering. The thickness of the second protective film 63 is, for example, not less than 0.1 μm and not more than 3 μm. The insulating layer 61 that covers the lateral surface of the n-side layer 11 also is transmissive to the light emitted by the active layer 13.

Figure 41:
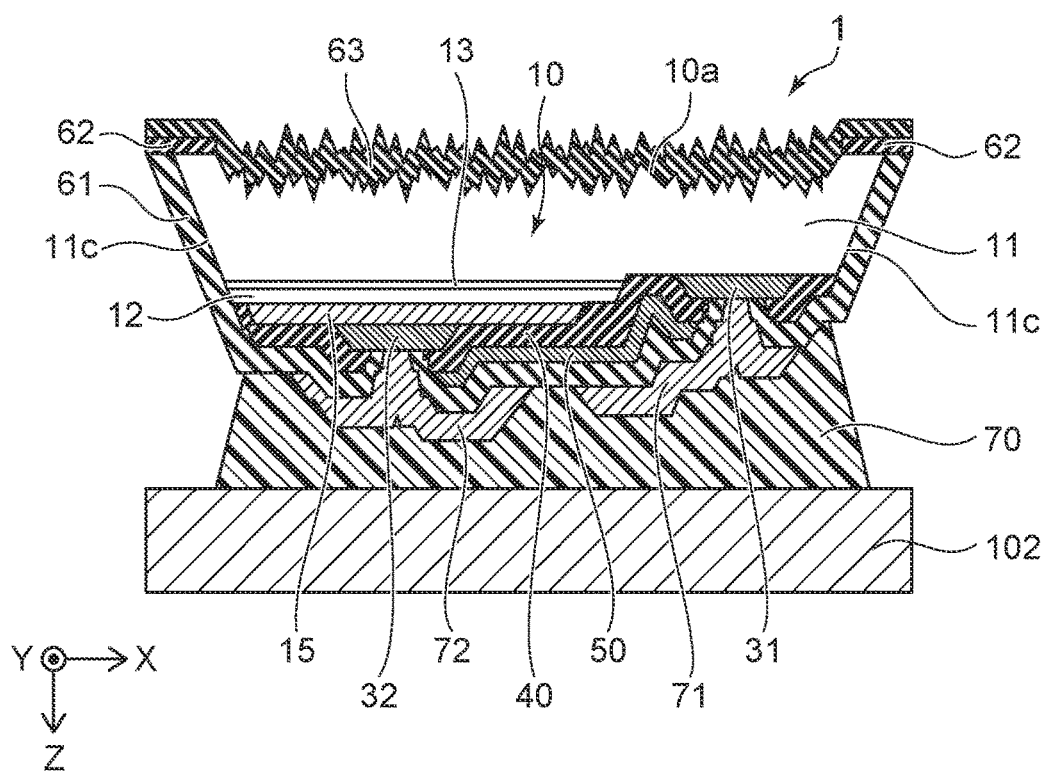
Figure 42:
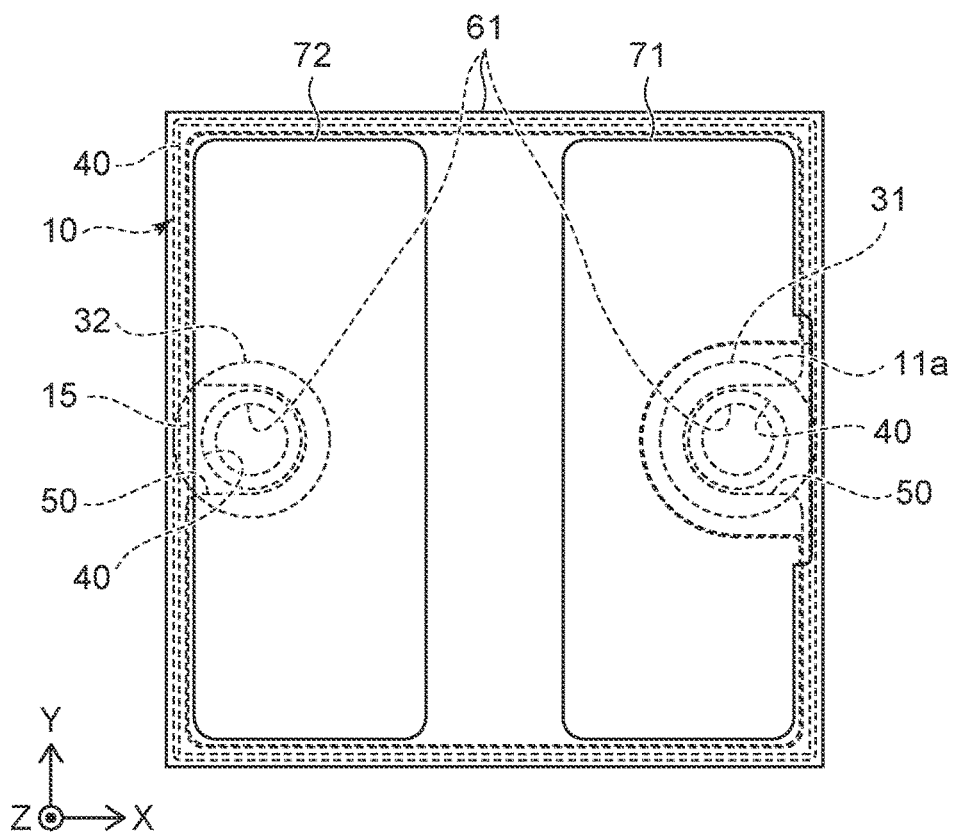
FIG. 42 is a schematic plan view of a light-emitting element of the embodiment.

Continuing, the first protective film 62, the second protective film 63, and a portion of the resin member 70 positioned between the singulated element parts 100 are removed by etching. As shown in FIG. 41, the multiple light-emitting elements 1 that are mutually-separated by a space on the second substrate 102 are obtained thereby. FIG. 42 shows an example of the bottom view of the light-emitting element 1 shown in FIG. 41.

The light-emitting element 1 is supported on the second substrate 102 via the resin member 70 with the surface at the side opposite to the first surface 10a facing the second substrate 102. For example, by irradiating laser light from the second substrate 102 side, the light-emitting element 1 can be detached from the second substrate 102 by removing a portion of the resin member 70. For the light-emitting element 1 detached from the second substrate 102, the surface at the side at which the second protective film 63 is formed is bonded to, for example, another support substrate that is adhesive. The light-emitting element 1 may be detached from the second substrate 102 after being bonded to the other support substrate. Subsequently, the first conductive member 71 and the second conductive member 72 are exposed by removing the resin member 70 remaining in the light-emitting element 1. For example, RIE can be used to remove the resin member 70 remaining in the light-emitting element 1. The exposed first conductive member 71 and second conductive member 72 function as external connection terminals bonded to a mounting substrate. The light-emitting element 1 is, for example, a light-emitting diode.

The light that is emitted by the active layer 13 is extracted outside the light-emitting element 1 mainly from the first surface 10a. The light that is emitted by the active layer 13 also is extracted outside the light-emitting element 1 from a lateral surface 11c of the n-side layer 11. According to the embodiment, the light extraction efficiency to the outside from the light-emitting element 1 can be increased by providing the first reflective layer 40 at the side opposite to the first surface 10a and by not locating a reflective layer at the lateral surface 11c. The ratio of the light extracted from the lateral surface 11c increases as the planar size of the light-emitting element 1 decreases. Accordingly, the effect of a structure in which a reflective layer is not located at the lateral surface 11c is increased when the length of one side of the first surface 10a in the top view is relatively small. For example, the effect is large when the size of one side of the first surface 10a in the top view is not more than 100 μm, and the effect is even larger when the size of one side of the first surface 10a in the top view is not more than 60 μm.

Compared to when a metal layer is used as the first reflective layer 40, the reflectance can be increased by forming, as the first reflective layer 40, a dielectric multilayer film having a lower optical absorptance than a metal layer. The reflectance can be further increased by also forming the second reflective layer 50 at the side opposite to the first surface 10a.

Hereinabove, exemplary embodiments of the present disclosure are described with reference to specific examples. However, the embodiments of the present disclosure are not limited to these specific examples. Furthermore, various modifications and alterations within the spirit of the present disclosure will be readily apparent to those skilled in the art. All such modifications and alterations should therefore be seen as within the scope of the present disclosure.

What is claimed is:
1. A method for manufacturing a light-emitting element, the method comprising:
  preparing a wafer that comprises:
    a semiconductor structure body comprising an n-side layer, an active layer located on the n-side layer, and a p-side layer located on the active layer, and
    a light-transmitting conductive film located on the p-side layer;
  forming a first mask on the light-transmitting conductive film;
  after the forming of the first mask, removing the light-transmitting conductive film exposed from the first mask to form an opening in the light-transmitting conductive film, the opening exposing the semiconductor structure body from under the light-transmitting conductive film;
  after the removing of the light-transmitting conductive film exposed from the first mask, forming an n-side exposed part at which a portion of the n-side layer is exposed from the p-side layer and the active layer by removing the semiconductor structure body exposed from the first mask;

after the forming of the n-side exposed part, removing the first mask;

after the removing of the first mask, forming a second mask on the light-transmitting conductive film at a position separated from an outer edge of the light-transmitting conductive film defining the opening in a top view;

after the forming of the second mask, removing the light-transmitting conductive film exposed from the second mask to expose the p-side layer from the light-transmitting conductive film;

forming an n-side electrode at the n-side exposed part;

after the removing of the light-transmitting conductive film exposed from the second mask, forming a third mask on the light-transmitting conductive film and on the semiconductor structure body; and after the forming of the third mask, removing the semiconductor structure body in a region not overlapping the third mask in the top view to form a groove in the semiconductor structure body, the groove dividing the semiconductor structure body into a plurality of element parts.

2. The method according to claim 1, wherein:
the removing of the semiconductor structure body exposed from the third mask comprises removing the semiconductor structure body so that, in a top view, a shortest distance between an outer edge of the light-transmitting conductive film and an outer edge of the n-side exposed part is greater than a shortest distance between the groove and the outer edge of the light-transmitting conductive film.

3. The method according to claim 1, wherein:
the removing of the light-transmitting conductive film exposed from the first mask comprises removing the light-transmitting conductive film by wet etching.

4. The method according to claim 2, wherein:
the removing of the light-transmitting conductive film exposed from the first mask comprises removing the light-transmitting conductive film by wet etching.

5. The method according to claim 3, wherein:
the removing of the light-transmitting conductive film exposed from the second mask comprises removing the light-transmitting conductive film by wet etching.

6. The method according to claim 4, wherein:
the removing of the light-transmitting conductive film exposed from the second mask comprises removing the light-transmitting conductive film by wet etching.

7. The method according to claim 5, wherein:
In the forming of the first mask comprises forming the first mask to have a plurality of openings;
the forming of the second mask comprises forming a plurality of the second masks separated from each other; and
a time of the wet etching when removing the light-transmitting conductive film exposed from the first mask is greater than a time of the wet etching when removing the light-transmitting conductive film exposed from the second masks.

8. The method according to claim 6, wherein:
the forming of the first mask comprises forming the first mask to have a plurality of openings;
the forming of the second mask comprises forming a plurality of the second masks separated from each other; and
a time of the wet etching when removing the light-transmitting conductive film exposed from the first mask is greater than a time of the wet etching when removing the light-transmitting conductive film exposed from the second masks.

9. The method according to claim 1, wherein:
the forming of the n-side exposed part by removing the semiconductor structure body exposed from the first mask comprises removing the semiconductor structure body by dry etching.

10. The method according to claim 3, wherein:
the forming of the n-side exposed part by removing the semiconductor structure body exposed from the first mask comprises removing the semiconductor structure body by dry etching.

11. The method according to claim 4, wherein:
the forming of the n-side exposed part by removing the semiconductor structure body exposed from the first mask comprises removing the semiconductor structure body by dry etching.

12. The method according to claim 1, wherein:
the n-side exposed part comprises an extension portion extending inward into the light-transmitting conductive film between the light-transmitting conductive film in the top view; and
the n-side electrode is formed at the extension portion.

* * * * *